(12) United States Patent
Kuindersma et al.

(10) Patent No.: US 11,585,979 B2
(45) Date of Patent: Feb. 21, 2023

(54) PHOTONIC INTEGRATED CIRCUIT HAVING IMPROVED ELECTRICAL ISOLATION BETWEEN N-TYPE CONTACTS

(71) Applicant: EFFECT PHOTONICS B.V., Eindhoven (NL)

(72) Inventors: Pieter Ids Kuindersma, Eindhoven (NL); Boudewijn Docter, Eindhoven (NL)

(73) Assignee: EFFECT PHOTONICS B.V., Eindhoven (NL)

( * ) Notice: Subject to any disclaimer, the term of this patent is extended or adjusted under 35 U.S.C. 154(b) by 533 days.

(21) Appl. No.: 16/735,797

(22) Filed: Jan. 7, 2020

(65) Prior Publication Data

US 2020/0264366 A1 Aug. 20, 2020

(30) Foreign Application Priority Data

Feb. 15, 2019 (EP) ..................................... 19157480

(51) Int. Cl.
*G02B 6/12* (2006.01)
*G02B 6/122* (2006.01)
*H01S 5/026* (2006.01)

(52) U.S. Cl.
CPC .............. *G02B 6/122* (2013.01); *H01S 5/026* (2013.01); *G02B 2006/12078* (2013.01);
(Continued)

(58) Field of Classification Search
CPC .......... G02B 6/122; G02B 2006/12078; G02B 2006/12121; G02B 2006/12123; G02B 2006/12142; H01S 5/026
(Continued)

(56) References Cited

U.S. PATENT DOCUMENTS

| 2004/0028105 A1 | 2/2004 | Peters |
| 2004/0121500 A1* | 6/2004 | Ketelsen ............. H01L 31/0203 257/E31.118 |
| 2005/0275053 A1 | 12/2005 | Shimizu et al. |

FOREIGN PATENT DOCUMENTS

| EP | 0645654 A1 | 3/1995 |
| EP | 0847113 A1 | 6/1998 |

(Continued)

OTHER PUBLICATIONS

EP Search Report for EP 19157480.5 dated Aug. 21, 2019.

*Primary Examiner* — Jerry M Blevins
(74) *Attorney, Agent, or Firm* — Hudak, Shunk & Farine Co. LPA

(57) ABSTRACT

A photonic integrated circuit including first and second opto-electronic devices that are fabricated on a semiconductor wafer having an epitaxial layer stack including an n-type indium phosphide-based contact layer that is provided with at least one selectively p-type doped tubular-shaped region for providing an electrical barrier between respective n-type contact regions of the first and second opto-electronic devices that are optically interconnected by a passive optical waveguide that is fabricated in a non-intentionally doped waveguide layer including indium gallium arsenide phosphide, the non-intentionally doped waveguide layer being arranged on top of the n-type contact layer, wherein a first portion of the at least one selectively p-type doped tubular-shaped region is arranged underneath the passive optical waveguide between the first and second opto-electronic devices. An opto-electronic system including the photonic integrated circuit.

17 Claims, 8 Drawing Sheets

(52) U.S. Cl.
CPC ............. *G02B 2006/12121* (2013.01); *G02B 2006/12123* (2013.01); *G02B 2006/12142* (2013.01)

(58) Field of Classification Search
USPC .......................................... 438/31
See application file for complete search history.

(56) References Cited

FOREIGN PATENT DOCUMENTS

| | | | |
|---|---|---|---|
| GB | 2561426 | A | 10/2018 |
| WO | 02058251 | A2 | 7/2002 |
| WO | 2018122393 | A1 | 7/2018 |

\* cited by examiner

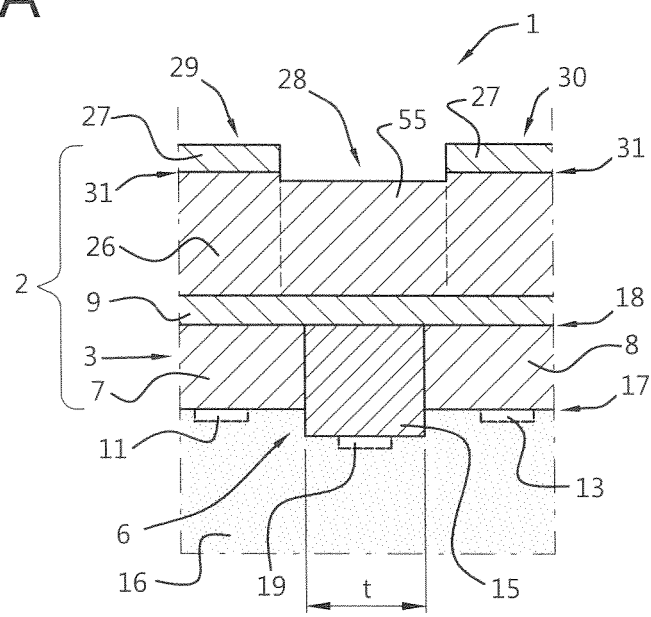
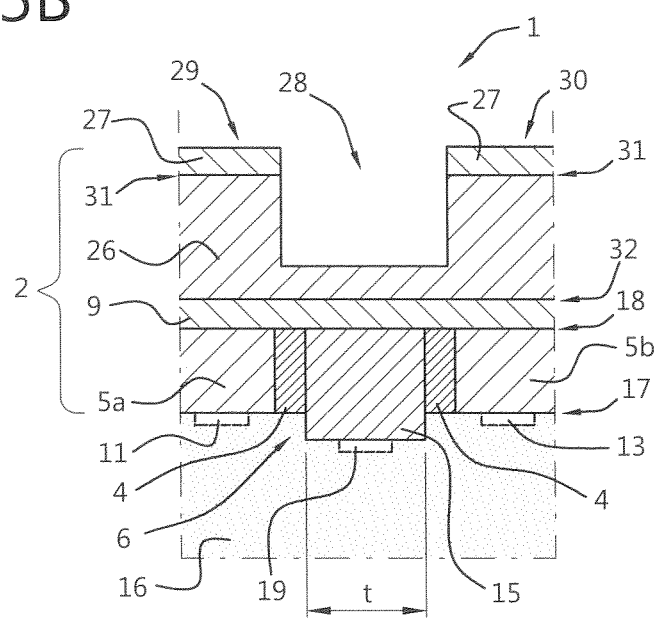

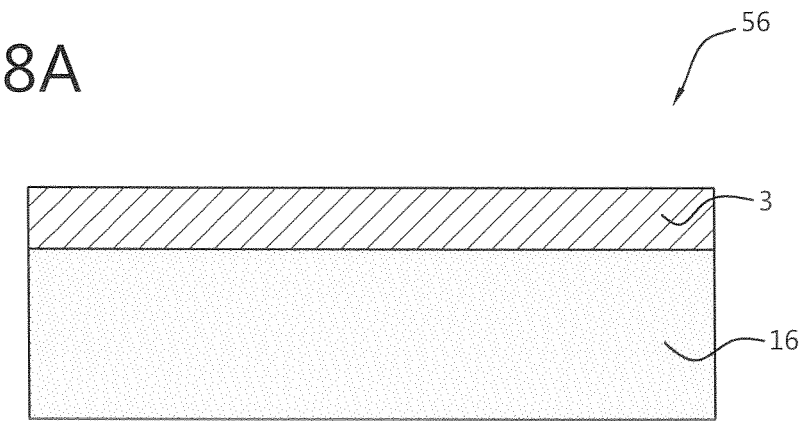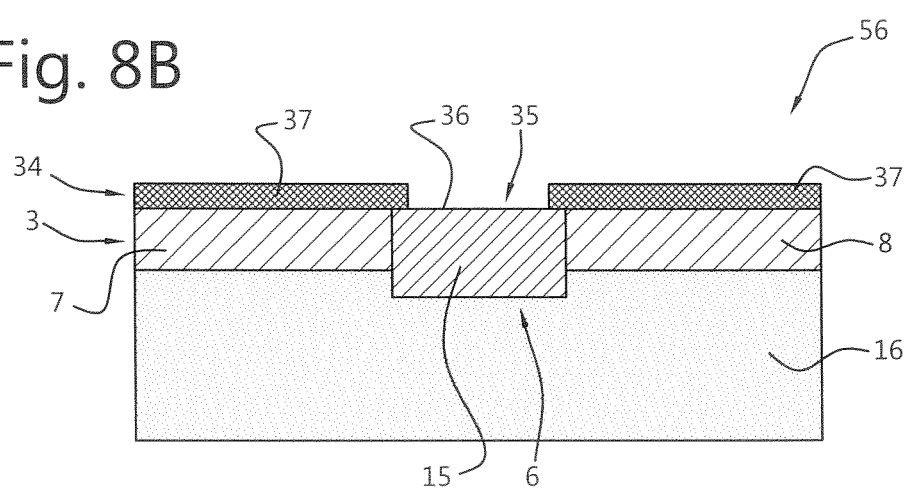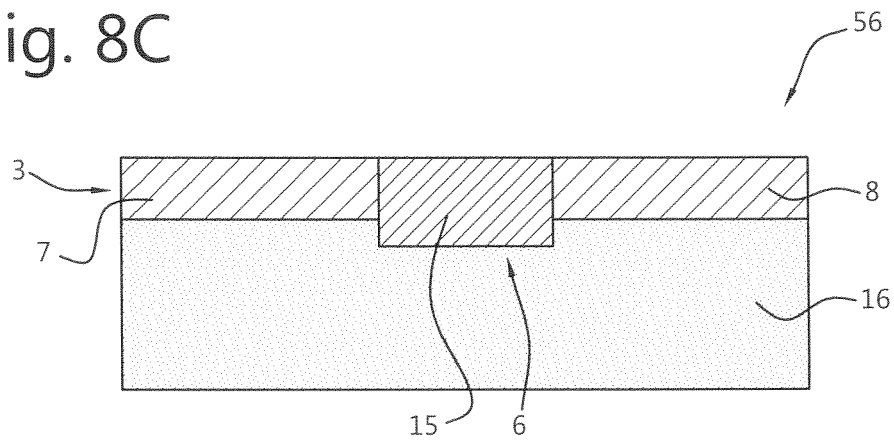

US 11,585,979 B2

PHOTONIC INTEGRATED CIRCUIT HAVING IMPROVED ELECTRICAL ISOLATION BETWEEN N-TYPE CONTACTS

FIELD OF THE INVENTION

The present invention relates to a photonic integrated circuit having improved electrical isolation between n-type contacts of a first opto-electronic device and n-type contacts of a second opto-electronic device of the photonic integrated circuit. The invention further relates to an opto-electronic system comprising said photonic integrated circuit.

BACKGROUND OF THE INVENTION

Modern photonic integrated circuits (PICs) become increasingly complex because of the increasing number of optical and electrical functions that are integrated on a single photonic chip. The most versatile technology platform for PICs uses semiconductor wafers comprising indium phosphide-based (InP) materials. InP-based technology offers the possibility to integrate both active components, e.g. light-generating and/or light-absorbing opto-electronic devices, and passive components, e.g. light-guiding and/or light-switching opto-electronic devices, into one PIC on a single photonic chip.

An exemplary PIC known in the art comprises for example light-generating, light-absorbing and light-switching components that are optically interconnected by passive optical waveguides. Each of the light-generating, light-absorbing and light-switching components requires n-type ohmic metal contacts and/or p-type ohmic metal contacts to their respective n-type doped or p-type doped contact regions. A disadvantage of such a PIC known in the art is that reduction of its footprint is limited because electrical isolation between the n-type doped contact regions of the different light-generating, light-absorbing and light-switching components is insufficient when these components are arranged too close together. This is caused by the fact that despite the possibility to etch away surplus n-type doped InP-based semiconductor material between the individual opto-electronic devices to increase the electrical isolation between their respective n-type doped contact regions, it is not possible to remove the n-type doped InP-based semiconductor material underneath the passive optical waveguides that are arranged to optically interconnect the individual opto-electronic devices. Another disadvantage of such a PIC known in the art in which the surplus n-type doped InP-based semiconductor material between the individual opto-electronic devices has been etched away to increase the electrical isolation between the respective n-type doped contact regions of the individual opto-electronic devices is that the aforementioned etching step adds additional topology to the surface of the photonic chip comprising the PIC. The additional surface topology can have negative effects on for example subsequent lithography steps during processing of the photonic chip.

Based on the above, there is a need to provide a PIC having improved electrical isolation between n-type doped contact regions of its different opto-electronic devices that are optically interconnected by a passive optical waveguide without interfering with the optical light path provided by the passive optical waveguide to enable further footprint reduction of photonic chips.

SUMMARY OF THE INVENTION

It is an object of the present invention to provide a photonic integrated circuit (PIC) that pre-empts or at least reduces at least one of the abovementioned and/or other disadvantages associated with PICs known in the art.

It is also an object of the present invention to provide an opto-electronic system comprising said PIC.

Aspects of the present invention are set out in the accompanying independent and dependent claims. Features from the dependent claims may be combined with features from the independent claim as appropriate and not merely as explicitly set out in the claims. Furthermore, all features may be replaced with other technically equivalent features.

At least one of the abovementioned objects is achieved by a photonic integrated circuit (PIC) comprising:
  a semiconductor wafer that has an epitaxial layer stack comprising:
    an n-type doped contact layer comprising indium phosphide or a non-intentionally doped layer comprising indium phosphide, said non-intentionally doped layer comprising at least two selectively n-type doped contact regions, wherein said n-type doped contact layer or said non-intentionally doped layer outside said at least two selectively n-type doped contact regions comprises a first selectively p-type doped tubular-shaped region that is configured and arranged to provide a first electrical barrier between:
      a first area of said n-type doped contact layer that is surrounded by said first selectively p-type doped tubular-shaped region and a second area of said n-type doped contact layer that is arranged outside said first selectively p-type doped tubular-shaped region; or
      a first selectively n-type doped contact region of said non-intentionally doped layer that is surrounded by said first selectively p-type doped tubular-shaped region and a second selectively n-type doped contact region of said non-intentionally doped layer that is arranged outside said first selectively p-type doped tubular-shaped region; and
    a non-intentionally doped waveguide layer comprising indium gallium arsenide phosphide that is arranged on top of said n-type doped contact layer or said non-intentionally doped layer;
  a first opto-electronic device that is arranged in said first area of said n-type doped contact layer that is surrounded by said first selectively p-type doped tubular-shaped region or in said first selectively n-type doped contact region of said non-intentionally doped layer that is surrounded by said first selectively p-type doped tubular-shaped region, said first opto-electronic device comprising a first n-type ohmic metal contact that is arranged at a first location on said n-type doped contact layer within said first area or at a first location on said first selectively n-type doped contact region;
  a second opto-electronic device that is arranged in said second area of said n-type doped contact layer that is arranged outside said first selectively p-type doped tubular-shaped region or in said second selectively n-type doped contact region of said non-intentionally doped layer that is arranged outside said first selectively p-type doped tubular-shaped region, said second opto-electronic device comprising a second n-type ohmic metal contact that is arranged at a second location on said n-type doped contact layer within said second area or at a second location on said second selectively n-type doped contact region; and
  a passive optical waveguide comprising said non-intentionally doped waveguide layer and being arranged to optically interconnect said first opto-electronic device and said second opto-electronic device, wherein a first portion of said first selectively p-type doped tubular-shaped region is arranged underneath said passive optical waveguide between said first opto-electronic device and said second opto-electronic device.

The person skilled in the art will appreciate that the n-type doped contact layer comprising indium phosphide or the non-intentionally doped layer comprising indium phosphide of PICs according to the present invention are provided with an n-p-n barrier comprising the first selectively p-type doped tubular-shaped region that is configured and arranged to prevent electrical charge carriers from leaking between the n-type doped contact region comprising the first n-type ohmic metal contact of the first opto-electronic device and the n-type doped contact region comprising the second n-type ohmic metal contact of the second opto-electronic device via portions of the n-type doped InP-based contact layer or the non-intentionally doped InP-based layer that are arranged underneath the passive optical waveguide that is arranged between said first opto-electronic device and said second opto-electronic device to optically interconnect them. In this way a PIC according to the present invention benefits from an improved so-called electrical n-isolation between the n-type doped contact regions of its different opto-electronic devices that are provided with n-type ohmic metal contacts. Moreover, the first portion of said first selectively p-type doped tubular-shaped region is configured such that optical losses in said passive optical waveguide that optically interconnects the first and second opto-electronic devices are minimal.

Based on the above, the person skilled in the art will appreciate that the opto-electronic devices of a PIC according to the present invention can be arranged closer to each other than opto-electronic devices of a PIC known in the art. Consequently, the footprint of a photonic chip comprising a PIC according to the present invention can be reduced compared to photonic chips comprising PICs known in the art. Furthermore, by providing the first selectively p-type doped tubular-shaped region, no undesired additional topology is added to the surface of the photonic chip comprising the PIC.

In an embodiment of the photonic integrated circuit according to the invention, at least said first portion of said first selectively p-type doped tubular-shaped region that is arranged underneath the non-intentionally doped waveguide layer of said passive optical waveguide has a thickness in a radial direction thereof between 1 μm-100 μm, preferably between 2 μm-10 μm. It is known in the art that p-type doped regions should be kept away from passive optical waveguides because they can cause extra optical losses. However, it has surprisingly been found that by keeping said thickness of the first portion of the first selectively p-type doped tubular-shaped region between 1 μm-100 μm, preferably between 2 μm-10 μm the extra optical losses can be kept minimal.

In an embodiment of the photonic integrated circuit according to the invention, said first selectively p-type doped tubular-shaped region comprises zinc as p-type dopant. Zinc is the most commonly used p-type dopant in InP-based semiconductor materials. Zinc is usually added to the MOCVD process to grow p-type doped InP-based layers. It is known in the art that zinc is able to diffuse through InP-based materials at temperatures close to or at the typical growth temperature of 500° C.–600° C. Therefore, it is also possible to use zinc diffusion after the growth of InP-based layers has been completed. In the art, zinc diffusion is a well-known process step in the fabrication of photodetectors. The diffusion depth can be well-controlled and high doping concentrations can be achieved.

In an embodiment of the photonic integrated circuit according to the invention, said first selectively p-type doped tubular-shaped region comprises an activated p-type doping concentration between $1\times10^{16}$ cm$^{-3}$-$2\times10^{18}$ cm$^{-3}$, preferably less than or equal to $1\times10^{17}$ cm$^3$. For the best electrical isolation performance, it may be beneficial to keep the activated p-type doping concentration between $1\times10^{16}$ cm$^{-3}$-$2\times10^{18}$ cm$^{-3}$, preferably less than or equal to $1\times10^{17}$ cm$^{-3}$. However, in the case that the semiconductor wafer of the PIC according to the invention has an epitaxial layer stack comprising an n-type doped InP-based contact layer, the p-type doping concentration must compensate for the initial n-type doping concentration to establish said first selectively p-type doped tubular-shaped region. The activated n-type doping concentration may be in the order of $5\times10^{18}$ cm$^{-3}$ to achieve a low-resistance n-type ohmic contact. Therefore, achieving a reproducible low p-type doping concentration, while compensating said high n-type doping concentration may be a problem.

Alternatively, the semiconductor wafer of the PIC according to the invention can have an epitaxial layer stack comprising a non-intentionally doped InP-based layer that comprises at least two selectively n-type doped contact regions obtained by ion-implantation of n-type dopants. In this case, the p-type doping concentration in the non-intentionally doped InP-based layer does not need to be as high as in the case of the n-type doped InP-based layer as the p-type dopants only need to compensate any non-intentional n-type dopants that may have been introduced during growth of said non-intentionally doped InP-based layer. Typical background doping levels of said non-intentionally doped InP-based layer are less than $1\times10^{17}$ cm$^{-3}$.

In an embodiment of the photonic integrated circuit according to the invention, the photonic integrated circuit comprises a substrate on top of which said n-type doped contact layer or said non-intentionally doped layer of said epitaxial layer stack is arranged, said substrate comprising one of semi-insulating indium phosphide, p-type doped indium phosphide and n-type doped indium phosphide that is compensated using iron atoms to provide at least a semi-insulating surface layer on top of which said n-type doped contact layer or said non-intentionally doped layer is arranged, wherein said first selectively p-type doped tubular-shaped region is arranged to extend in an axial direction thereof at least from a first boundary between said substrate and said n-type doped contact layer or said non-intentionally doped layer to a second boundary between said n-type doped contact layer or said non-intentionally doped layer and said non-intentionally doped waveguide layer. Depending on the chosen penetration depth of the p-type dopants, the first selectively p-type doped tubular-shaped region can be configured and arranged to start at said first boundary or at a predetermined distance beyond said first boundary in said substrate and to stop at said second boundary.

In an embodiment of the photonic integrated circuit according to the invention, said first selectively p-type doped tubular-shaped region is provided with a first p-type ohmic metal contact. In this way it is possible to electrically contact the first selectively p-type doped tubular-shaped region for example for biasing purposes.

In an embodiment of the photonic integrated circuit according to the invention, a short circuit is arranged between said first p-type ohmic metal contact and one of said first n-type ohmic metal contact of said first opto-electronic device and said second n-type ohmic metal contact of said second opto-electronic device. In this way, the abovementioned n-isolation can be electrically controlled when the PIC is operated. The person skilled in the art will appreciate that the short circuit between said first p-type ohmic metal contact and one of said first and second n-type ohmic metal contacts can be established using a metal layer of the back-end metal layers. In the case that there is no short circuit between said first p-type ohmic metal contact and one of said first and second n-type ohmic metal contacts, the abovementioned n-isolation is floating.

In an embodiment of the photonic integrated circuit according to the invention, said n-type doped contact layer or said non-intentionally doped layer outside said at least two selectively n-type doped contact regions comprises a second selectively p-type doped tubular-shaped region that is arranged at a predetermined distance of said first selectively p-type doped tubular shaped region and configured to surround said first selectively p-type doped tubular-shaped region to provide a second electrical barrier between:

said first area of said n-type doped contact layer that is surrounded by both said first selectively p-type doped tubular-shaped region and said second selectively p-type doped tubular-shaped region and said second area of said n-type doped contact layer that is arranged outside both said first selectively p-type doped tubular-shaped region and said second selectively p-type doped tubular-shaped region; or said first selectively n-type doped contact region of said non-intentionally doped layer that is surrounded by both said first selectively p-type doped tubular-shaped region and said second selectively p-type doped tubular-shaped region and said second selectively n-type doped contact region of said non-intentionally doped layer that is arranged outside both said first selectively p-type doped tubular-shaped region and said second selectively p-type doped tubular-shaped region;

wherein a second portion of said second selectively p-type doped tubular-shaped region is arranged underneath said passive optical waveguide between said first opto-electronic device and said second opto-electronic device, wherein at least one of said first selectively p-type doped tubular-shaped region and said second selectively p-type doped tubular-shaped region comprises zinc as p-type dopant, and wherein each of said first selectively p-type doped tubular-shaped region and said second selectively p-type doped tubular-shaped region comprises an activated p-type doping concentration between $1\times10^{16}$ cm$^{-3}$-$2\times10^{18}$ cm$^{-3}$, preferably less than or equal to $1\times10^{17}$ cm$^{-3}$.

By providing said second selectively p-type doped tubular-shaped region an additional electrical barrier and therefore further improved n-isolation between the n-type doped contact regions of the first opto-electronic device and the n-type doped contact regions of the second opto-electronic device that are provided with n-type ohmic metal contacts can be achieved.

In an embodiment of the photonic integrated circuit according to the invention, at least said first portion of said first selectively p-type doped tubular-shaped region and at least said second portion of said second selectively p-type doped tubular-shaped region that are arranged underneath the non-intentionally doped waveguide layer of said passive optical waveguide each have a thickness in a radial direction thereof between 1 μm-100 μm, preferably between 2 μm-10 μm. It has surprisingly been found that by keeping said thickness of at least said first portion of the first selectively p-type doped tubular-shaped region and at least said second portion of the second selectively p-type doped tubular-shaped region between 1 μm-100 μm, preferably between 2 μm-10 μm the extra optical losses in said passive optical waveguide can be kept minimal.

In an embodiment of the photonic integrated circuit according to the invention, the photonic integrated circuit comprises a substrate on top of which said n-type doped contact layer or said non-intentionally doped layer of said epitaxial layer stack is arranged, said substrate comprising one of semi-insulating indium phosphide, p-type doped indium phosphide and n-type doped indium phosphide that is compensated using iron atoms to provide at least a semi-insulating surface layer on top of which said n-type doped contact layer or said non-intentionally doped layer is arranged, wherein at least one of said first selectively p-type doped tubular-shaped region and said second selectively p-type doped tubular-shaped region is arranged to extend in an axial direction thereof at least from a first boundary between said substrate and said n-type doped contact layer or said non-intentionally doped layer to a second boundary between said n-type doped contact layer or said non-intentionally doped layer and said non-intentionally doped waveguide layer. Depending on the chosen penetration depth of the p-type dopants, at least one of the first selectively p-type doped tubular-shaped region and the second selectively p-type doped tubular-shaped region can be configured and arranged to start at said first boundary and/or at a predetermined distance beyond said first boundary in said substrate, and to stop at said second boundary.

In an embodiment of the photonic integrated circuit according to the invention, said first selectively p-type doped tubular-shaped region is provided with a first p-type ohmic metal contact and/or said second selectively p-type doped tubular-shaped region is provided with a second p-type ohmic metal contact. In this way it is possible to electrically contact at least one of the first selectively p-type doped tubular-shaped region and the second selectively p-type doped tubular-shaped region for example for biasing purposes.

In an embodiment of the photonic integrated circuit according to the invention, a third area of said n-type doped contact layer that is arranged between said first selectively p-type doped tubular-shaped region and said second selectively p-type doped tubular-shaped region or a third selectively n-type doped contact region of said non-intentionally doped layer that is arranged between said first selectively p-type doped tubular-shaped region and said second selectively p-type doped tubular-shaped region is provided with a third n-type ohmic metal contact, wherein a short circuit is arranged between at least one of:

said first p-type ohmic metal contact and one of said first n-type ohmic metal contact of said first opto-electronic device, said second n-type ohmic metal contact of said second opto-electronic device, and said third n-type ohmic metal contact; and said second p-type ohmic metal contact and one of said first n-type ohmic metal contact of said first opto-electronic device, said second n-type ohmic metal contact of said second opto-electronic device, and said third n-type ohmic metal contact.

In this way, the n-isolation provided by said first selectively p-type doped tubular-shaped region and/or the n-isolation provided by said second selectively p-type doped tubular-shaped region can be electrically controlled when the PIC is operated. The person skilled in the art will appreciate that the respective short circuits can be established using at least one metal layer of the back-end metal layers. In the case that there is no short circuit between said first p-type ohmic metal contact and one of said first, second and third n-type ohmic metal contacts, the n-isolation provided by said first selectively p-type doped tubular-shaped region is floating. In an analogous way, if there is no short circuit between said second p-type ohmic metal contact and one of said first, second and third n-type ohmic metal contacts, the n-isolation provided by said second selectively p-type doped tubular-shaped region is floating. Hence, each of the n-isolations can either be electrically controlled or floating.

In an embodiment of the photonic integrated circuit according to the invention, the epitaxial layer stack further comprises:
- a p-type doped cladding layer comprising indium phosphide that is arranged on top of said non-intentionally doped waveguide layer; and
- a p-type doped contact layer comprising indium gallium arsenide that is arranged on top of said p-type doped cladding layer, said p-type doped contact layer having a higher activated p-type doping concentration than said p-type doped cladding layer; and wherein said p-type doped contact layer is provided with a recess that is configured and arranged such that said p-type doped contact layer is interrupted and is provided with a first p-type doped contact area and a second p-type doped contact area, the recess having a width, as seen in a direction parallel to a third boundary between said p-type doped contact layer and said p-type doped cladding layer, in a range between 5 μm and 200 μm, preferably 30 μm. The recess can be provided by etching away a predefined portion of said p-type doped contact layer having a width in the aforementioned range. The p-type doped contact layer within the predefined portion is etched away to a depth as seen in a direction transverse to the width of the predefined portion that corresponds to the complete thickness of said p-type doped contact layer.

In this way, a PIC according to the present invention is provided with so-called electrical p-isolation, i.e. electrical isolation between the p-type doped contact regions within and/or between the different opto-electronic devices of the PIC that are provided with p-type ohmic metal contacts.

In an embodiment of the photonic integrated circuit according to the invention, the recess is configured and arranged to extend into the p-type doped cladding layer up to a predefined distance from a fourth boundary between said p-type doped cladding layer and the non-intentionally doped waveguide layer, the predefined distance from said fourth boundary being in a range between 0.5 μm and 5 μm, preferably between 1 μm and 2 μm. In this case the recess is provided by etching away a predefined part having a width in the range between 5 μm and 200 μm, preferably 30 μm that comprises the complete p-type doped contact layer and a portion of the p-type doped cladding layer as seen in a direction transverse to the width of the predefined part up to said predefined distance from said fourth boundary. In this way the PIC according to the present invention can be provided with improved electrical p-isolation.

According to another aspect of the present invention, an opto-electronic system is provided comprising a photonic integrated circuit according to the invention. Examples of PICs according to the invention are balanced photodetectors, laser-MZI modulators. These PICs can advantageously be implemented in opto-electronic systems such as tunable optical transceivers or optical coherent transceivers.

Further features and advantages of the invention will become apparent from the description of the invention by way of exemplary and non-limiting embodiments of a photonic integrated circuit (PIC) and an opto-electronic system comprising such a PIC The person skilled in the art will appreciate that the described embodiments of the PIC and the opto-electronic system are exemplary in nature only and not to be construed as limiting the scope of protection in any way. The person skilled in the art will realize that alternatives and equivalent embodiments of the PIC and the opto-electronic system can be conceived and reduced to practice without departing from the scope of protection of the present invention.

BRIEF DESCRIPTION OF THE DRAWINGS

Reference will be made to the figures on the accompanying drawing sheets. The figures are schematic in nature and therefore not necessarily drawn to scale. Furthermore, equal reference numerals denote equal or similar parts. On the attached drawing sheets.

FIG. 5A shows a schematic cross-sectional view of a first exemplary, non-limiting embodiment of an epitaxial layer stack of a part of a PIC according to the present invention;

FIG. 5B shows a schematic cross-sectional view of a second exemplary, non-limiting embodiment of an epitaxial layer stack of a part of a PIC according to the present invention;

FIGS. 8A-8D show schematic cross-sectional views of a first exemplary, non-limiting embodiment of a semiconductor wafer that is manufactured using a first exemplary, non-limiting embodiment of a method according to the present invention;

DETAILED DESCRIPTION OF EMBODIMENTS

Figure 1:
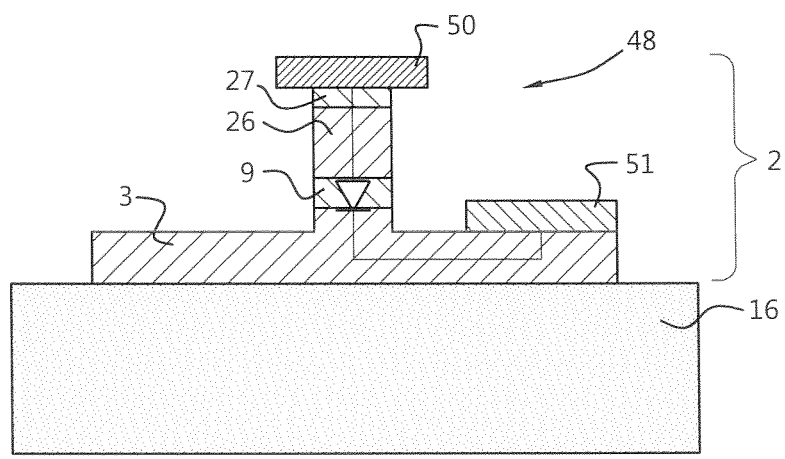
FIG. 1 shows a schematic cross-section of a typical waveguide structure for use in an indium phosphide-based (InP) photonic integrated circuit (PIC) known in the art.

FIG. 1 shows a schematic cross-section of a typical waveguide structure 48 for use in an indium phosphide-based (InP) photonic integrated circuit (PIC) known in the art. The typical waveguide structure 48 comprises an epitaxial layer stack 2 that comprises an intrinsic or non-intentionally doped indium gallium arsenide phosphide (InGaAsP) waveguide layer 9 that is sandwiched between a p-type doped InP cladding layer 26 and an n-type doped InP contact layer 3. The waveguide structure 48 basically forms a PIN-diode 49 that is schematically indicated between the top and the bottom of the waveguide structure 48. The waveguide structure 48 is configured to achieve light generation due to recombination of electrons and holes in the intrinsic or non-intentionally doped InGaAsP layer 9 when the PIN-diode 49 is operated in forward bias. In the case that the PIN-diode 49 is operated in reverse bias, the waveguide structure 48 operates in so-called photodiode mode in which electrons and holes that are generated due to absorption of light impinging on the PIN-diode 49 need to be extracted. The waveguide structure 48 can also be used in for example electro-optic modulators in which the refractive index of the intrinsic or non-intentionally doped InGaAsP waveguide layer is changed depending on the electric field across the reverse biased PIN-diode 49.

The abovementioned different semiconductor layers can be epitaxially grown either on a substrate 16 comprising one of semi-insulating indium phosphide, p-type doped indium phosphide and n-type doped indium phosphide that is compensated using iron atoms to provide at least a semi-insulating surface layer. On top of either one of the aforementioned substrates said n-type doped contact layer 3 can be grown using one of metalorganic chemical vapour deposition (MOCVD), metalorganic vapour-phase epitaxy (MOVPE) and molecular-beam epitaxy (MBE).

After consecutively growing the n-type doped InP contact layer 3, the intrinsic or non-intentionally doped InGaAsP waveguide layer 9, the p-type doped InP cladding layer 26, and a p-type doped indium gallium arsenide (InGaAs) contact layer 27 that has a higher activated p-type doping concentration than the p-type doped InP cladding layer 26 on the substrate 16, the waveguide structure 48 is fabricated using lithography and etching processes. The p-type doped InGaAs contact layer 27 is provided with an p-type ohmic metal contact 50 and the n-type doped InP contact layer 3 is provided with an n-type ohmic metal contact 51 that are formed using a metal deposition process.

As shown in FIG. 1, the n-type doped InP contact layer 3 outside the waveguide structure 48 has been removed using a subsequent etching process thereby exposing the surface of the substrate 16. As a result, the n-type ohmic metal contact 11 has been electrically isolated from n-type ohmic metal contacts of other building blocks (not shown) that are arranged on the same substrate 16.

Figure 2:
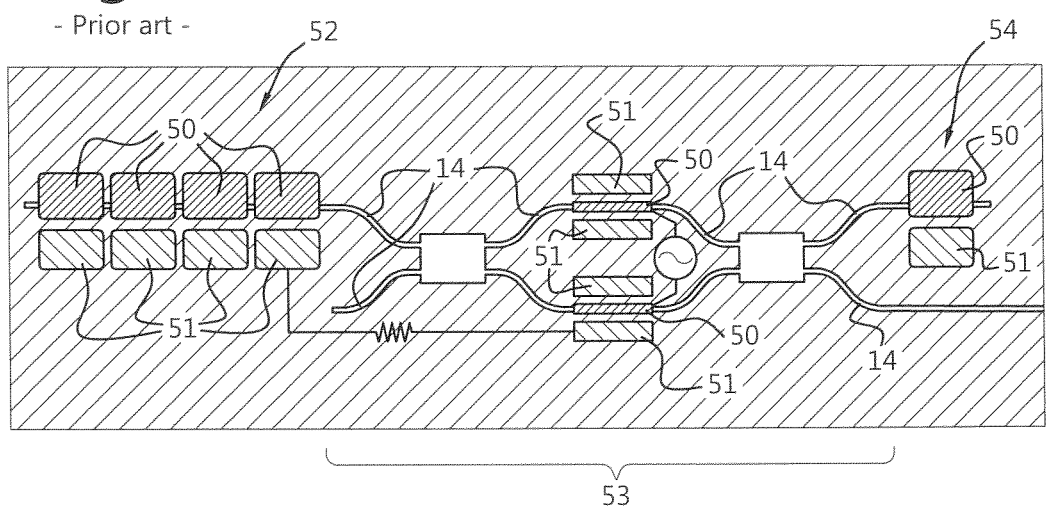
FIG. 2 shows a schematic top view of a PIC known in the art in which a distributed Bragg reflector (DBR) laser, a Mach-Zehnder modulator (MZM) and an output monitor photodiode (PD) are operatively connected with each other via passive optical waveguides. The DBR laser, the MZM and the output monitor PD comprising the waveguide structure the cross-section of which is shown in FIG. 1.

FIG. 2 shows a schematic top view of a PIC known in the art comprising a distributed Bragg reflector (DBR) laser 52 as a non-limiting example of a first opto-electronic device, a Mach-Zehnder modulator (MZM) 53 as a non-limiting example of a second opto-electronic device and an output monitor photodiode (PD) 54 as a non-limiting example of a third opto-electronic device. The DBR laser 52, the MZM 53 and the output monitor PD 54 are optically interconnected via passive optical waveguides 14. The DBR laser 52, the MZM 53 and the output monitor PD 54 comprise the waveguide structure 48 the cross-section of which is shown in FIG. 1. The person skilled in the art will appreciate that a complete electrical isolation of n-type ohmic metal contacts 51 of the DBR laser 52, the MZM 53 and the output monitor PD 54, respectively cannot be achieved by etching away the n-type doped InP contact layer 3 between these components because the parts of the n-type doped InP contact layer 3 that are located underneath the intrinsic or non-intentionally doped InGaAsP waveguide layer 9 of the passive optical waveguides 14 cannot be removed. In order to establish sufficient electrical isolation between the n-type ohmic metal contacts of the DBR laser 52, the MZM 53 and the output monitor PD 54, respectively there needs to be sufficient distance between these opto-electronic devices. As a result, it is difficult to reduce the footprint of the known PIC shown in FIG. 2.

In addition, the additional etching step for removing the n-type doped InP contact layer 3 between the DBR laser 52, the MZM 53 and the output monitor PD 54 can result in additional undesired surface topology. The additional surface topology can have negative effects on for example subsequent lithography steps during processing of the PIC.

Furthermore, it is noted that when operating the PIC shown in FIG. 2, the p-type ohmic metal contacts 50 and the n-type ohmic metal contacts 51 of the DBR laser 52 are operated in forward bias, i.e. the typical voltage drop over p-type and n-type ohmic metal contacts is in the order of 0.7V-2.0V. The easiest way to operate the DBR laser 52, the MZM 53 and the output monitor 54 is to connect the n-type ohmic metal contacts to 0V and generate a variable bias at the p-type ohmic metal contacts, although in some cases it may also be beneficial to connect the p-type ohmic metal contacts to a fixed supply voltage of for example 3.3V and regulate the bias of the n-type ohmic metal contacts.

The MZM 53 is typically operated by applying a differential radio frequency (RF) voltage between the p-type ohmic metal contacts 50 of both arms of the MZM 53. This differential bias always needs to be lower than the bias of the n-type ohmic metal contacts, otherwise the PIN-diode 49 of the waveguide structure 48 does not operate in reverse bias. In fact, for high-speed operation the DC bias over each arm of the MZM 53 should be in the range of −5V to −10V. This can either be achieved by adding a negative DC bias to the RF voltage driver, or by putting a positive bias on the n-type ohmic metal contacts. From an electrical point of view, the latter is preferred, as it does not only remove the requirement of a bias-T, but also makes RF termination of the high-speed contacts easier as no DC blocking capacitor is required.

Based on the above, the person skilled in the art will appreciate that it is beneficial that the respective n-type ohmic metal contacts 51 of at least the DBR laser 52 and the MZM 53 of the PIC shown in FIG. 2 are electrically isolated. Therefore, there is a need to provide a PIC having improved and ideally complete electrical isolation between the n-type ohmic metal contacts of its different opto-electronic devices that are optically interconnected by passive optical waveguides. In the context of this patent application, the electrical isolation between the n-type ohmic metal contacts of different opto-electronic devices of a PIC is referred to as n-isolation. The person skilled in the art will appreciate that the improved n-isolation in accordance with the present invention should affect, e.g. in terms of attenuation, the light signals in the passive optical waveguides interconnecting the different opto-electronic devices as little as possible and preferably not at all. As a result, the improved n-isolation in accordance with the present invention enables further reduction of the footprint of PICs.

Figure 3:
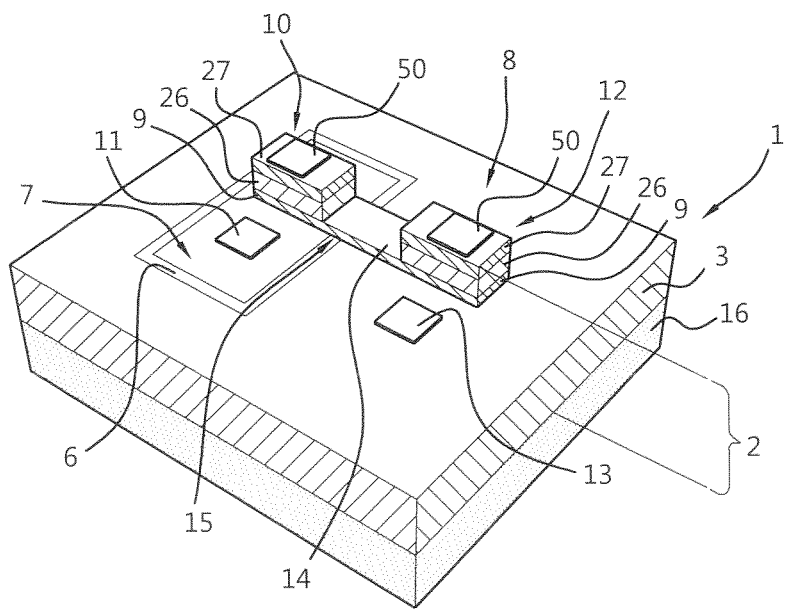
FIG. 3 shows a schematic perspective view of a first exemplary, non-limiting embodiment of a PIC according to the present invention.

FIG. 3 shows a schematic perspective view of a first exemplary, non-limiting embodiment of a PIC 1 according to the present invention that comprises a semiconductor wafer having an epitaxial layer stack 2 that comprises an n-type doped contact layer 3 comprising indium phosphide (InP). The n-type doped contact layer 3 is provided with a first selectively p-type doped tubular-shaped current blocking region 6. The fact that the first selectively p-type doped region 6 has a tubular shape when viewed in three dimensions will be appreciated by the skilled person having regard to among others FIGS. 5A and 5B.

The first selectively p-type doped tubular-shaped region 6 is configured and arranged to provide a first electrical barrier between the first area 7 of the n-type doped contact layer 3 that is surrounded by the first selectively p-type doped tubular-shaped region 6 and the second area 8 of the n-type doped contact layer 3 that is arranged outside the first selectively p-type doped tubular-shaped region 6. The epitaxial layer stack 2 further comprises a non-intentionally doped waveguide layer 9 comprising indium gallium arsenide phosphide (InGaAsP) that is arranged on top of said n-type doped contact layer 3. The PIC 1 comprises a first opto-electronic device 10 that is arranged in said first area 7 of said n-type doped contact layer 3 that is surrounded by said first selectively p-type doped tubular-shaped region 6. The first opto-electronic device 10 comprises a first n-type ohmic metal contact 11 that is arranged at a first location on said n-type doped contact layer 3 within said first area 7. The PIC 1 also comprises a second opto-electronic device 12 that is arranged in said second area 8 of said n-type doped contact layer 3 that is arranged outside said first selectively p-type doped tubular-shaped region 6. The second opto-electronic device 12 comprises a second n-type ohmic metal contact 13 that is arranged at a second location on said n-type doped contact layer 3 within said second area 8. The PIC 1 also comprises a passive optical waveguide 14 comprising said non-intentionally doped waveguide layer 9. The passive optical waveguide 14 is arranged to optically interconnect the first opto-electronic device 10 and the second opto-electronic device 12. As can be seen in FIG. 3, a first portion 15 of the first selectively p-type doped tubular-shaped region 6 is arranged underneath the passive optical waveguide 14 between the first opto-electronic device 10 and the second opto-electronic device 12.

The person skilled in the art will appreciate that the PIC 1 as shown in FIG. 3 has an improved n-isolation compared to the n-isolation achieved in the known PIC shown in FIG. 2. In particular the first portion 15 of the first selectively p-type doped tubular-shaped region 6 that is arranged underneath the passive optical waveguide 14 prevents charge carriers from leaking between the first n-type ohmic metal contact 11 of the first opto-electronic device 10 and the second n-type ohmic metal contact 13 of the second opto-electronic device 12 via the part of the n-type doped contact layer 3 that is arranged underneath the passive optical waveguide 14 between the first opto-electronic device 10 and the second opto-electronic device 12.

Furthermore, the PIC 1 according to the present invention having the abovementioned improved n-isolation does not suffer from any undesired additional surface topology that would result from the less ideal n-isolation using conventional etching techniques.

Figure 4:
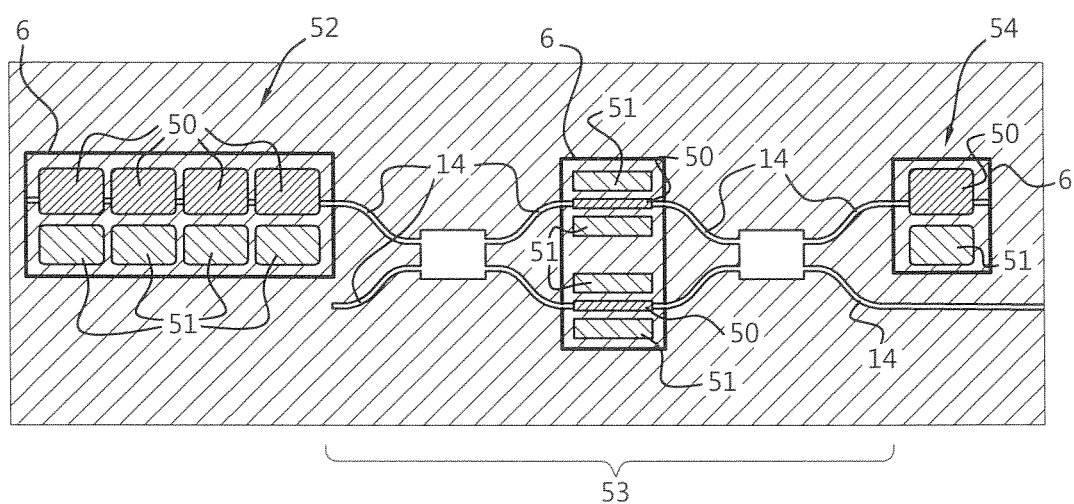
FIG. 4 shows a schematic top view of a second exemplary, non-limiting embodiment of a PIC according to the present invention in which a DBR laser, an MZM and an output monitor PD are operatively connected with each other via passive optical waveguides.

FIG. 4 shows a schematic top view of a second exemplary, non-limiting embodiment of a PIC 1 according to the present invention in which a DBR laser 52 as a non-limiting example of the first opto-electronic device 10, an MZM 53 as a non-limiting example of the second opto-electronic device 12 and an output monitor PD 54 are operatively connected with each other via passive optical waveguides 14. Instead of etching away the n-type doped InP contact layer 3 between the DBR laser 52, the MZM 53 and the output monitor PD 54 to establish n-isolation as good as possible, the present invention proposes to provide the n-type doped InP contact layer 3 with selectively p-type doped regions 6 that when viewed in three dimensions have a tubular-shape. The selectively p-type doped tubular-shaped regions 6 are arranged around the DBR laser 52, the MZM 53 and the output monitor PD 54 to electrically isolate the respective n-type ohmic metal contacts of these devices by preventing electrical charge carriers from leaking between the n-type ohmic metal contacts of the DBR laser 52, the MZM 53 and the output monitor PD 54, respectively even via portions of the n-type doped InP contact layer 3 that are arranged underneath the passive optical waveguides 14. In this way, the PIC 1 as shown in FIG. 4 has a significantly improved n-isolation compared to the n-isolation achieved in the known PIC shown in FIG. 2. It is to be noted that the portions of the respective selectively p-type doped tubular-shaped regions 6 that are located underneath the passive optical waveguides 14 are configured such that optical losses in the passive optical waveguides 14 are minimal. Furthermore, the PIC 1 according to the present invention shown in FIG. 4 does not suffer from any undesired additional surface topology that would result from the less ideal n-isolation using conventional etching techniques.

Although not apparent from a comparison of FIGS. 2 and 4, the person skilled in the art will appreciate that the DBR laser 52, the MZM 53 and the output monitor PD 54 of the PIC 1 shown in FIG. 4 can be arranged closer to each other due to the improved n-isolation involving the selectively p-type doped tubular-shaped regions 6. Consequently, the footprint of the PIC 1 according to the present invention as shown in FIG. 4 can be reduced compared to the footprint of the prior art PIC that is shown in FIG. 2.

Further details of the epitaxial layer stack 2 of the PIC 1 according to the present invention and in particular with respect to the selectively p-type doped regions 6 will be discussed in relation to FIGS. 5A, 5B, 6 and 7. FIG. 5A shows a schematic cross-sectional view of a first exemplary, non-limiting embodiment of an epitaxial layer stack 2 of a part of a PIC 1 according to the present invention. The epitaxial layer stack 2 shown in FIG. 5A is grown on a substrate 16 that comprises one of semi-insulating indium phosphide (s.i.-InP), p-type doped indium phosphide (p-InP) and n-type doped indium phosphide (n-InP) that is compensated using iron (Fe) atoms to provide at least a semi-insulating surface layer on top of which an n-type doped contact layer 3 is grown using one of the traditional epitaxial techniques MOCVD, MOVPE or MBE mentioned above. The n-type doped contact layer 3 is provided with said first selectively p-type doped tubular-shaped region 6 shown in FIG. 3. It is noted that FIG. 5A only shows the cross-section of a first portion 15 of a branch of the first selectively p-type doped tubular-shaped region 6 that taking FIG. 3 into account is arranged between the first opto-electronic device 10 and the second opto-electronic device 12 and underneath the non-intentionally doped waveguide layer 9 of the passive optical waveguide 14 of the PIC 1 shown in FIG. 3.

FIG. 5A shows that the first portion 15 of said branch of the first selectively p-type doped tubular-shaped region 6 extends from a second boundary 18 between the n-type doped contact layer 3 and the non-intentionally doped waveguide layer 9 across the n-type doped contact layer 3 into the substrate 16 to a predefined distance beyond a first boundary 17 between the substrate 16 and the n-type doped contact layer 3. The person skilled in the art will appreciate that depending on the chosen penetration depth of the p-type dopants, the first portion 15 of said branch of the selectively p-type doped tubular-shaped region 6 alternatively can be configured and arranged to start at said first boundary 17 and to stop at said second boundary 18.

It is known in the art that p-type doped regions should be kept away from passive optical waveguides because they can cause extra optical losses. However, it has surprisingly been found that by keeping a thickness t of the first portion 15 of said branch of the first selectively p-type doped tubular-shaped region 6 between 1 μm-100 μm, preferably between 2 μm-10 μm the extra optical losses can be kept minimal.

The first selectively p-type doped tubular-shaped region 6 comprises zinc (Zn) as p-type dopant. The zinc atoms are arranged in a predefined area of the n-type doped contact layer 3 using a diffusion process at a temperature in a range of 500° C.-600° C. after the n-type doped InP contact layer 3 has been grown and before the non-intentionally doped waveguide layer 9 is grown.

For the best electrical isolation performance the first selectively p-type doped tubular-shaped region 6 of a PIC according to the invention comprises an activated p-type doping concentration between $1\times10^{16}$ cm$^{-3}$-$2\times10^{18}$ cm$^{-3}$, preferably less than or equal to $1\times10^{17}$ cm$^{-3}$. In the case of the n-type doped InP contact layer 3, the p-type doping concentration must compensate for the initial n-type doping concentration to establish said first selectively p-type doped tubular-shaped region 6. The activated n-type doping concentration of the n-type doped InP contact layer 3 may be in the order of $5\times10^{18}$ cm$^{-3}$ to achieve low-resistance n-type ohmic metal contacts. Hence, achieving a reproducible low p-type doping concentration, while compensating said high n-type doping concentration may be a problem. A remedy for this will be discussed into more detail in relation to FIG. 5B.

The epitaxial layer stack 2 of the PIC 1 shown in FIG. 5A further comprises a p-type doped cladding layer 26 comprising indium phosphide that is arranged on top of said non-intentionally doped waveguide layer 9, and a p-type doped contact layer 27 comprising indium gallium arsenide that is arranged on top of said p-type doped cladding layer 26. The p-type doped contact layer 27 has a higher activated p-type doping concentration than said p-type doped cladding layer 26 for allowing the formation of low-resistance p-type ohmic metal contacts.

FIG. 5A shows that the p-type doped contact layer 27 is provided with a recess 28 that interrupts the p-type doped contact layer 27 and extends into the p-type doped cladding layer 26 slightly beyond a third boundary 31 between the p-type doped contact layer 27 and the p-type doped cladding layer 26. In this way the recess 28 provides the p-type doped contact layer 27 with a first p-type doped contact area 29 and a second p-type doped contact area 30. The recess 28 has a width, as seen in a direction parallel to the third boundary 31 in a range between 5 μm and 200 μm, preferably 30 μm. The recess 28 can be provided by etching away a predefined portion of the p-type doped contact layer 27 and the p-type doped cladding layer 26 underneath having a width in the aforementioned range. In this way, a PIC 1 according to the present invention is provided with so-called electrical p-isolation, i.e. electrical isolation between the first p-type doped contact area 29 and the second p-type doped contact area 30 that can be part of different opto-electronic devices of the PIC 1. The first p-type doped contact area 29 and the second p-type doped contact area 30 can be provided with respective p-type ohmic metal contacts.

As can be seen in FIG. 5A, the n-type doped contact layer 3 is divided into a first area 7 and a second area 8 that are electrically isolated by the first portion 15 of said branch of the first selectively p-type doped tubular-shaped region 6. The p-type doped contact layer 27 is divided into said first p-type doped contact area 29 and said second p-type doped contact area 30 that are electrically isolated by the recess 28 and the relatively highly resistive portion 55 of the p-type doped cladding layer 26 underneath the recess 28. The first area 7 of the n-type doped contact layer 3 and the first p-type doped contact area 29 of the p-type doped contact layer 27 form a first diode that can belong to a first opto-electronic device of the PIC 1. The second area 8 of the n-type doped contact layer 3 and the second p-type doped contact area 30 of the p-type doped contact layer 27 form a second diode that can belong to a second opto-electronic device of the PIC 1. The person skilled in the art will appreciate that said first diode and said second diode can be electrically operated in forward bias or in reverse bias, electrically independent of each other. Furthermore, although said first and second diodes of said first and second opto-electronic devices are mutually electrically isolated, they are optically interconnected by the optical waveguide layer 9.

The first portion 15 of said branch of said first selectively p-type doped tubular-shaped region 6 can be provided with a first p-type ohmic metal contact 19 that only schematically has been indicated in FIG. 5A. The same applies to the first n-type ohmic metal contact 11 to the first area 7 of the n-type doped contact layer 3 and the second n-type ohmic metal contact 13 to the second area 8 of the n-type doped contact layer 3. The person skilled in the art will appreciate that the first n-type ohmic metal contact 11 to the first area 7 of the n-type doped contact layer 3, the second n-type ohmic metal contact 13 to the second area 8 of the n-type doped contact layer 3, and the first p-type ohmic metal contact 19 to the first portion 15 of said branch of said first selectively p-type doped tubular-shaped region 6 fall outside the cross-sectional plane shown in FIG. 5A. In the shown plane they would of course have crossed the passive optical waveguide layer 9.

Despite the schematic indication of the first p-type ohmic metal contact 19 to the first portion 15 of said branch of said first selectively p-type doped tubular-shaped region 6, the person skilled in the art will appreciate that in this way it is possible to electrically contact the first portion 15 of said branch of said first selectively p-type doped tubular-shaped region 6 for example for biasing purposes.

For example, it is possible to arrange a short circuit between said first p-type ohmic metal contact 19 and said first n-type ohmic metal contact 11 or between said first p-type ohmic metal contact 19 and said second n-type ohmic metal contact 13. In this way, the abovementioned n-isolation can be electrically controlled when the PIC 1 is operated. The person skilled in the art will appreciate that the short circuit between said first p-type ohmic metal contact 19 and one of said first 11 and second 13 n-type ohmic metal contacts can be established using a metal layer of the back-end metal layers. Such an externally arranged short circuit between said first n-type ohmic metal contact 11 to said first area 7 of the n-type doped contact layer 3 of said first diode and said first p-type ohmic metal contact 19 to the first portion 15 of said branch of said first selectively p-type doped tubular-shaped region 6 can be particularly advantageous when said second diode, which comprises the second area 8 of the n-type doped contact layer 3 and the second p-type doped contact area 30 of the p-type doped contact layer 27, is reverse biased with the p-type ohmic metal contact to the second p-type doped contact area 30 being connected to ground. In the case that there is no short circuit between said first p-type ohmic metal contact 19 and one of said first 11 and second 13 n-type ohmic metal contacts, the abovementioned n-isolation is floating.

FIG. 5B shows a schematic cross-sectional view of a second exemplary, non-limiting embodiment of an epitaxial layer stack 2 of a part of a PIC 1 according to the present invention. The epitaxial layer stack 2 shown in FIG. 5B is grown on a substrate 16 that comprises one of semi-insulating indium phosphide (s.i.-InP), p-type doped indium phosphide (p-InP) and n-type doped indium phosphide (n-InP) that is compensated using iron (Fe) atoms to provide at least a semi-insulating surface layer on top of which a non-intentionally doped InP layer 4 is grown using one of the traditional epitaxial techniques MOCVD, MOVPE or MBE mentioned above. After growing the non-intentionally doped InP layer 4, it is provided with a first selectively n-type doped contact region 5a and a second selectively n-type doped contact region 5b using ion-implantation of n-type dopants. The two selectively n-type doped contact regions 5a, 5b allow the formation of low-resistance n-type ohmic metal contacts.

After the ion-implantation process, the part of the non-intentionally doped InP layer 4 between the two selectively n-type doped contact regions 5a, 5b is provided with said first selectively p-type doped tubular-shaped region 6 using the abovementioned zinc diffusion process. As the zinc atoms are diffused into a non-intentionally doped InP layer, the p-type doping concentration does not need to be as high as in the case of the n-type doped InP layer 3 that was described in relation to FIG. 5A. In the case of the non-intentionally doped layer 4 of the epitaxial layer stack 2 shown in FIG. 5B, the p-type dopants only need to compensate any non-intentional n-type dopants that may have been introduced during growth of said non-intentionally doped InP layer 4. Typical background doping levels of said non-intentionally doped InP layer 4 are less than $1 \times 10^{17}$ $cm^{-3}$.

It is noted that also FIG. 5B only shows the cross-section of a first portion 15 of a branch of the first selectively p-type doped tubular-shaped region 6 that taking FIG. 3 into account is arranged between the first opto-electronic device 10 and the second opto-electronic device 12 and underneath the non-intentionally doped waveguide layer 9 of the passive optical waveguide 14 of the PIC 1 shown in FIG. 3. The person skilled in the art will appreciate that with respect to the first portion 15 of said branch of the first selectively p-type doped tubular-shaped region 6 the same observations can be made as described above in relation to FIG. 5A.

For the sake of clarity it is noted that the first selectively p-type doped tubular-shaped region 6 is configured and arranged to provide a first electrical barrier between said first selectively n-type doped contact region 5a that taking FIG. 3 into account would be surrounded by said first selectively p-type doped tubular-shaped region 6, and said second selectively n-type doped contact region 5b that then would be arranged outside said first selectively p-type doped tubular-shaped region 6.

As can be seen in FIG. 5B, a non-intentionally doped waveguide layer 9 comprising indium gallium arsenide phosphide (InGaAsP) is arranged on top of said non-intentionally doped layer 4. Having regard to FIG. 3, a first opto-electronic device 10 could be arranged in said first selectively n-type doped contact region 5a that is surrounded by said first selectively p-type doped tubular-shaped region 6. Said first opto-electronic device 10 comprising a first n-type ohmic metal contact 11 that could be arranged at a first location on said first selectively n-type doped contact region 5a. A second opto-electronic device 12 could be arranged in said second selectively n-type doped contact region 5b that is arranged outside said first selectively p-type doped tubular-shaped region 6. Said second opto-electronic device 12 comprising a second n-type ohmic metal contact 13 that is arranged at a second location on said second selectively n-type doped contact region 5b.

Analogous to FIG. 5A, it is noted that the first p-type ohmic metal contact 19 to the first portion 15 of said branch of said first selectively p-type doped tubular-shaped region 6, the first n-type ohmic metal contact 11 to the first selectively n-type doped contact region 5a, and the second n-type ohmic metal contact 13 to the second selectively n-type doped contact region 5b have only been schematically indicated in FIG. 5B. The person skilled in the art will appreciate that these contacts fall outside the cross-sectional plane shown in FIG. 5B. In the shown plane they would of course have crossed the passive optical waveguide layer 9.

In an analogous way as described in relation to FIG. 5A, the first p-type ohmic metal contact 19 to the first portion 15 of said branch of said first selectively p-type doped tubular-shaped region 6 can be used for electrically controlling the above-mentioned n-isolation.

As can be seen in FIG. 5B, the first selectively n-type doped contact region 5a of the non-intentionally doped layer 4 and the second selectively n-type doped contact region 5b of the non-intentionally doped layer 4 are electrically isolated by the first portion 15 of said branch of the first selectively p-type doped tubular-shaped region 6. The p-type doped contact layer 27 is divided into said first p-type doped contact area 29 and said second p-type doped contact area 30 that are electrically isolated by the recess 28 and the relatively highly resistive portion 55 of the p-type doped cladding layer 26 underneath the recess 28. In order to improve the electrical isolation between said first p-type doped contact area 29 and said second p-type doped contact area 30 in comparison to the PIC shown in FIG. 5A, the recess 28 has been extended further into the p-type doped cladding layer 26 up to a predefined distance from a fourth boundary 32 between the p-type doped cladding layer 26 and the non-intentionally doped waveguide layer 9. The predefined distance from said fourth boundary 32 can be in a range between 0.5 μm and 5 μm, preferably between 1 μm and 2 μm in order to not disturb the optical waveguide capabilities of the passive optical waveguide layer 9, e.g. to not introduce any undesired optical losses as a result of the etch to implement the recess 28.

In this case the recess 28 is provided by etching away a predefined part having a width in the range between 5 μm and 200 μm, preferably 30 μm that comprises the complete p-type doped contact layer 27 and a portion of the p-type doped cladding layer 26 as seen in a direction transverse to the width of the predefined part up to said predefined distance from said fourth boundary 32. In this way, the PIC 1 shown in FIG. 5B is provided with an improved electrical p-isolation in comparison to the PIC 1 shown in FIG. 5A.

Figure 6:
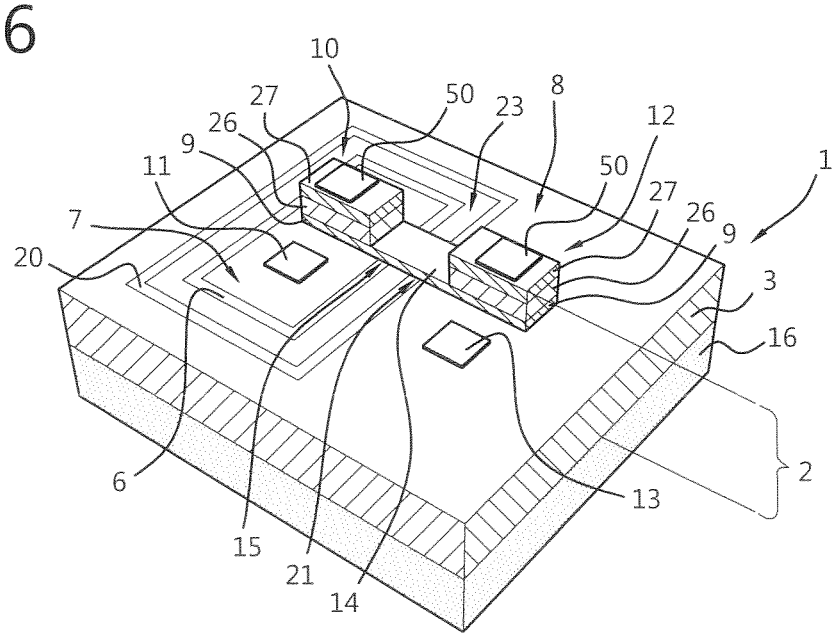
FIG. 6 shows a schematic perspective view of a third exemplary, non-limiting embodiment of a PIC according to the present invention.
Figure 7:
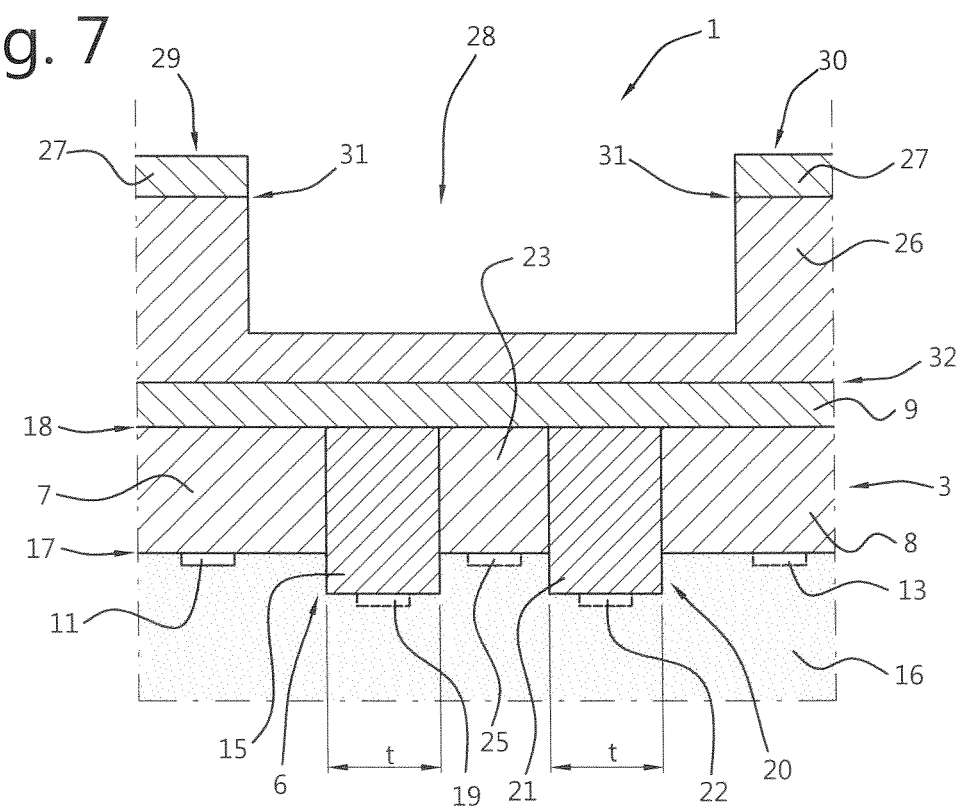
FIG. 7 shows a schematic cross-sectional view of a third exemplary, non-limiting embodiment of an epitaxial layer stack of a part of a PIC according to the present invention.

FIG. 6 shows a schematic perspective view of a third exemplary, non-limiting embodiment of a PIC 1 according to the present invention. Analogously to FIG. 3, the PIC 1 shown in FIG. 6 comprises a semiconductor wafer having an epitaxial layer stack 2 that comprises an n-type doped contact layer 3 comprising indium phosphide (InP). The n-type doped contact layer 3 is provided with a first selectively p-type doped tubular-shaped current blocking region 6 and a second selectively p-type doped tubular-shaped current blocking region 20 that is arranged around the first selectively p-type doped tubular-shaped region 6 and at a predetermined distance therefrom. The second selectively p-type doped tubular shaped region 20 comprises a branch of which a second portion 21 is arranged underneath said passive optical waveguide 14 between said first opto-electronic device 10 and said second opto-electronic device 12. The person skilled in the art will appreciate that the considerations regarding the technical features of the PIC as shown in FIG. 6 has in common with the PIC as shown in FIG. 3 are the same. For the sake of clarity these considerations will not be repeated. Having regard to FIG. 7 further details relating to the second selectively p-type doped tubular-shaped region 20 will be described, FIG. 7 shows a schematic cross-sectional view of a third exemplary, non-limiting embodiment of an epitaxial layer stack 2 of a part of a PIC 1 according to the present invention, e.g. the PIC shown in FIG. 6. In the cross-sectional view of FIG. 7, the second portion 21 of the second selectively p-type doped tubular-shaped region 20 is arranged in the n-type doped contact layer 3 at a predetermined distance from the first portion 15 of the first selectively p-type doped tubular-shaped region 6 underneath the non-intentionally doped waveguide layer 9 of the passive optical waveguide 14. A third area 23 of the n-type doped contact layer 3 is arranged between the first portion 15 of the first selectively p-type doped region 6 and the second portion 21 of the second selectively p-type doped region 20. The person skilled in the art will appreciate that the second selectively p-type doped tubular-shaped region 20 provides a second electrical barrier between the first area 7 of the n-type doped contact layer 3 that is surrounded by both said first selectively p-type doped tubular-shaped region 6 and said second selectively p-type doped tubular-shaped region 20, and the second area 8 of said n-type doped contact layer 3 that is arranged outside both said first selectively p-type doped tubular-shaped region 6 and said second selectively p-type doped tubular-shaped region 20. By providing said second selectively p-type doped tubular-shaped region 20 the abovementioned n-isolation between the n-type doped contact regions of the first opto-electronic device and the n-type doped contact regions of the second opto-electronic device that are provided with n-type ohmic metal contacts can further be improved. The person skilled in the art will appreciate that a PIC comprising more than two selectively p-type doped tubular-shaped current blocking regions that are arranged around each other also falls within the scope of the present invention. More than two selectively p-type doped tubular-shaped regions that are arranged around each other can be required depending on the level of isolation that is needed for a specific application.

In the embodiment shown in FIG. 7 both the first selectively p-type doped tubular-shaped region 6 and the second selectively p-type doped tubular-shaped region 20 comprise zinc as p-type dopant, both having an activated p-type doping concentration between $1 \times 10^{16}$ cm$^{-3}$-$2 \times 10^{18}$ cm$^{-3}$, preferably less than or equal to $1 \times 10^{17}$ cm$^{-3}$. In accordance with other exemplary embodiments falling within the scope of the present invention, the type of p-type dopant atoms used for the first and second selectively p-type doped tubular-shaped regions 6, 20 can be different. The same applies to the activated p-type doping concentrations. The person skilled in the art will know suitable p-type dopant atoms and activated p-type doping concentrations.

It is noted that at least the first portion 15 of said first selectively p-type doped tubular-shaped region 6 and at least the second portion 21 of said second selectively p-type doped tubular-shaped region 20 that are arranged underneath the non-intentionally doped waveguide layer 9 of said passive optical waveguide 14 each have a thickness t between 1 µm-100 µm, preferably between 2 µm-10 µm. It has surprisingly been found that by keeping said thicknesses t of at least said first portion 15 of the first selectively p-type doped tubular-shaped region 6 and of at least said second portion 21 of the second selectively p-type doped tubular-shaped region 20 between 1 µm-100 µm, preferably between 2 µm-10 µm undesired additional optical losses in said passive optical waveguide 14 can be kept minimal.

The person skilled in the art will appreciate that in accordance with another exemplary embodiment of the epitaxial layer stack 2 falling within the scope of the present invention, the first and second selectively p-type doped tubular-shaped regions 6, 20 can also be provided between selectively n-type doped contact regions of a non-intentionally doped InP layer that is grown on the substrate 16.

Furthermore, FIG. 7 shows that both the first portion 15 of said first selectively p-type doped tubular-shaped region 6 and the second portion 21 of said second selectively p-type doped tubular-shaped region 20 extend from the second boundary 18 between the n-type doped contact layer 3 and the non-intentionally doped waveguide layer 9 beyond the first boundary 17 between the substrate 16 and the n-type doped contact layer 3 up to a predefined distance into the substrate 16. In accordance with other exemplary embodiments falling within the scope of the present invention, it is also possible that one of said first selectively p-type doped tubular-shaped region 6 and said second selectively p-type doped tubular-shaped region 20 is arranged to extend from said second boundary 18 up to said first boundary 17 while the other is arranged to extend beyond said first boundary 17.

As described above in relation to FIGS. 5A and 5B, FIG. 7 schematically shows that the first portion 15 of the selectively p-type doped tubular-shaped region 6 is provided with a first p-type ohmic metal contact 19 and the second portion 21 of the second selectively p-type doped tubular-shaped region 20 is provided with a second p-type ohmic metal contact 22. In this way it is possible to electrically contact the first portion 15 of the first selectively p-type doped tubular-shaped region 6 and the second portion 21 of the second selectively p-type doped tubular-shaped region 20 for example for biasing purposes. As described above, contacting the first and second selectively p-type doped regions enables electrical control of the n-isolation.

Furthermore, FIG. 7 schematically shows that the third area 23 of the n-type doped contact layer 3 that is arranged between the first portion 15 of the selectively p-type doped tubular-shaped region 6 and the second portion 21 of the second selectively p-type doped tubular-shaped region 20 is provided with a third n-type ohmic metal contact 25. The person skilled in the art will appreciate that a short circuit can be arranged between the first p-type ohmic metal contact 19 and one of the first n-type ohmic metal contact 11, the second n-type ohmic metal contact 13, and the third n-type ohmic metal contact 25, and/or between the second p-type ohmic metal contact 22 and one of the first n-type ohmic metal contact 11, the second n-type ohmic metal contact 13, and the third n-type ohmic metal contact 25.

As described in relation to FIGS. 5A and 5B the skilled person will appreciate that the respective n-type ohmic metal contacts and p-type ohmic metal contacts schematically shown in FIG. 7 fall outside the shown cross-sectional plane. The respective short circuits that can be established between these contacts can be implemented using at least one metal layer of the back-end metal layers. In the case that there is no short circuit between said first p-type ohmic metal contact 19 and one of said first 11, second 13 and third 25 n-type ohmic metal contacts, the n-isolation provided by said first selectively p-type doped tubular-shaped region 6 is floating. In an analogous way, if there is no short circuit between said second p-type ohmic metal contact 22 and one of said first 11, second 13 and third 25 n-type ohmic metal contacts, the n-isolation provided by said second selectively p-type doped tubular-shaped region 20 is floating. Hence, each of the n-isolations can either be electrically controlled or floating.

FIGS. 8A-8D show schematic cross-sectional views of a first exemplary, non-limiting embodiment of a semiconductor wafer 56 that is manufactured using a first exemplary, non-limiting embodiment of a method according to the present invention. The semiconductor wafer 56 enables the fabrication of a PIC according to the invention.

FIG. 8A shows the result of first and second process steps of the first embodiment of the method. In the first process step a substrate 16 is provided that comprises one of semi-insulating indium phosphide (s.i.-InP), p-type doped indium phosphide (p-InP) and n-type doped indium phosphide (n-InP) that is compensated using iron (Fe) atoms to provide at least a semi-insulating surface layer. In the second process step, an n-type doped contact layer 3 comprising indium phosphide is grown on top of the substrate 16 using any one of the conventional epitaxial growth techniques MOCVD, MOVPE and MBE.

FIG. 8B shows the result of third, fourth and fifth process steps of the first embodiment of the method. In the third process step a masking layer 34 is deposited on top of said n-type doped contact layer 3. The masking layer 34 comprising at least one of a silicon oxide ($SiO_x$) and a silicon nitride ($SiN_x$). In the fourth process step a lithographic process followed by a first selective etching process are used to provide a tubular-shaped recess in the masking layer 34 to expose a surface area 36 of the n-type doped contact layer 3. In the cross-sectional view of FIG. 8B only a first portion 35 of the tubular-shaped recess is shown. In the fifth process step a diffusion process is used to diffuse p-type dopants, such as zinc (Zn) atoms, into the n-type doped contact layer 3 via the exposed surface area 36. In this way a first selectively p-type doped tubular-shaped current blocking region 6 is provided in the n-type doped contact layer 3 as has been described for example in relation to FIGS. 3 and 5A. The first selectively p-type doped tubular-shaped current blocking region 6 having an activated p-type doping concentration between $1\times10^{16}$ $cm^{-3}$-$2\times10^{18}$ $cm^{-3}$, preferably less than or equal to $1\times10^{17}$ $cm^{-3}$. By providing the first selectively p-type doped tubular-shaped current blocking region 6 a first area 7 of the n-type doped contact layer 3 is established that is surrounded by the first selectively p-type doped tubular-shaped current blocking region 6 and a second area 8 of the n-type doped contact layer 3 that is arranged outside said first selectively p-type doped tubular-shaped current blocking region 6. In the cross-sectional view of FIG. 8B only a first portion 15 of the first selectively p-type doped tubular-shaped region 6 is shown. The person skilled in the art will appreciate that depending on the degree of current blocking that is required for a specific application multiple selectively p-type doped tubular-shaped current blocking regions can be arranged that surround each other as has been described in relation to FIGS. 6 and 7.

FIG. 8C shows the result of a sixth process step of the first embodiment of the method. In the sixth process step a second selective etching process is used for selectively removing remaining parts 37 of the masking layer 34 from the n-type doped contact layer 3.

Figure 8D:
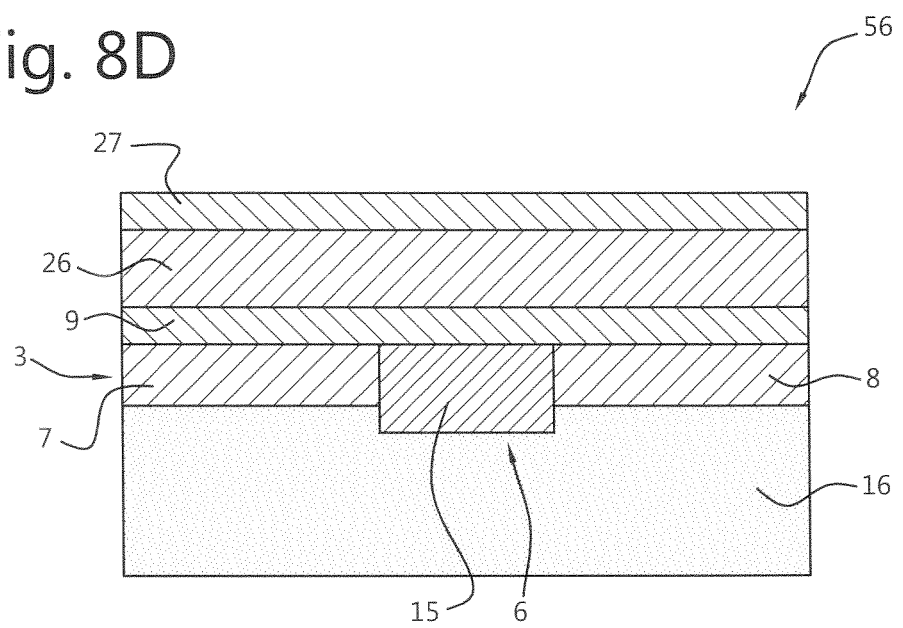

FIG. 8D shows the result of seventh, eighth, and ninth process steps of the first embodiment of the method. In the seventh process step a non-intentionally doped waveguide layer 9 comprising indium gallium arsenide phosphide (InGaAsP) is epitaxially grown on top of the n-type doped contact layer 3 comprising the first selectively p-type doped tubular-shaped region 6. The non-intentionally doped waveguide layer 9 enables the fabrication of a passive optical waveguide that enables optical communication between a first opto-electronic device and a second opto-electronic device that are fabricated on the semiconductor wafer 56. The n-type ohmic metal contacts of the first opto-electronic device are electrically isolated from the n-type ohmic metal contacts of the second opto-electronic device by the first selectively p-type doped tubular-shaped current blocking region 6.

In the eighth process step a p-type doped cladding layer 26 comprising indium phosphide (InP) is epitaxially grown on top of the non-intentionally doped waveguide layer 9. In the ninth process step a p-type doped contact layer 27 comprising indium gallium arsenide (InGaAs) is epitaxially grown on top of said p-type doped cladding layer 26. The p-type doped contact layer 27 has a higher activated p-type doping concentration than the p-type doped cladding layer 26 to allow the formation of low-resistance p-type ohmic metal contacts.

FIGS. 9A-9E show schematic cross-sectional views of a second exemplary, non-limiting embodiment of a semiconductor wafer 56 that is manufactured using a second exemplary, non-limiting embodiment of a method according to the present invention. The semiconductor wafer 56 enables the fabrication of a PIC according to the invention.

Figure 9A:
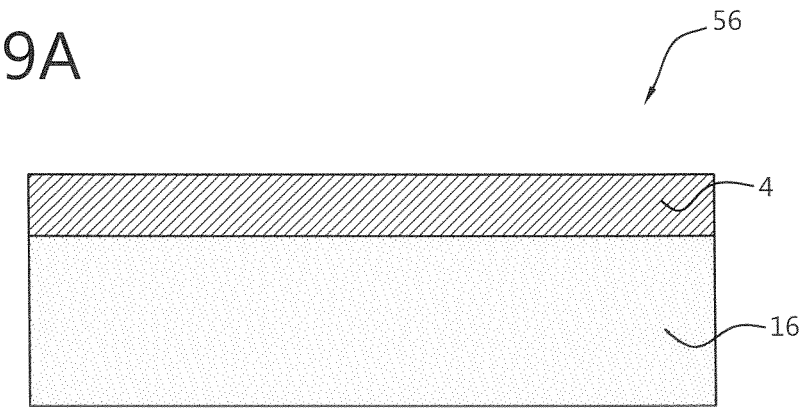
FIGS. 9A-9E show schematic cross-sectional views of a second exemplary, non-limiting embodiment of a semiconductor wafer that is manufactured using a second exemplary, non-limiting embodiment of a method according to the present invention.

FIG. 9A shows the result of first and second process steps of the second embodiment of the method. In the first process step a substrate 16 is provided that comprises one of semi-insulating indium phosphide (s.i.-InP), p-type doped indium phosphide (p-InP) and n-type doped indium phosphide (n-InP) that is compensated using iron (Fe) atoms to provide at least a semi-insulating surface layer. In the second process step, a non-intentionally doped layer 4 comprising indium phosphide is grown on top of the substrate 16 using any one of the conventional epitaxial growth techniques MOCVD, MOVPE and MBE.

Figure 9B:
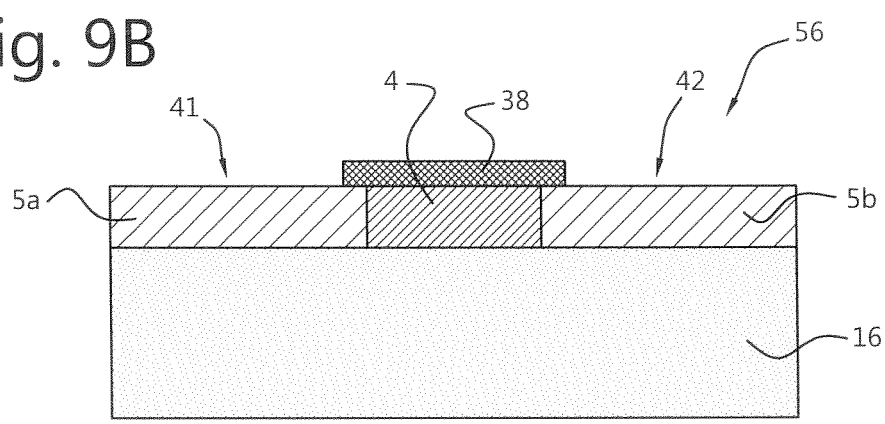

FIG. 9B shows the result of third, fourth, and fifth process steps of the second embodiment of the method. In the third process step, a first masking layer 38 is deposited on top of and completely covering the non-intentionally doped layer 4. The first masking layer 38 comprises at least one of a silicon oxide ($SiO_x$) and a silicon nitride ($SiN_x$). In the fourth process step a first lithographic process followed by a first selective etching process are used for selectively removing parts of the first masking layer 38 to expose a first surface area 41 and a second surface area 42 of the non-intentionally doped layer 4. In the fifth process step an ion implantation process is used to implant ions of an n-type dopant into the non-intentionally doped layer 4 via the first surface area 41 and the second surface area 42, respectively to provide the non-intentionally doped layer 4 with a first selectively n-type doped contact region 5a and a second selectively n-type doped contact region 5b. In a sixth process step (not shown) a second selective etching process is used for selectively removing the remaining of the first masking layer 38 that covers the portion of the non-intentionally doped layer 4 between the first 5a and second 5b selectively n-type doped contact regions. In a seventh process step (not shown) the substrate 16 and the non-intentionally doped layer 4 comprising the first 5a and second 5b selectively n-type doped contact regions are subjected to an annealing process to repair any crystal damage induced by the ion implantation process.

Figure 9C:
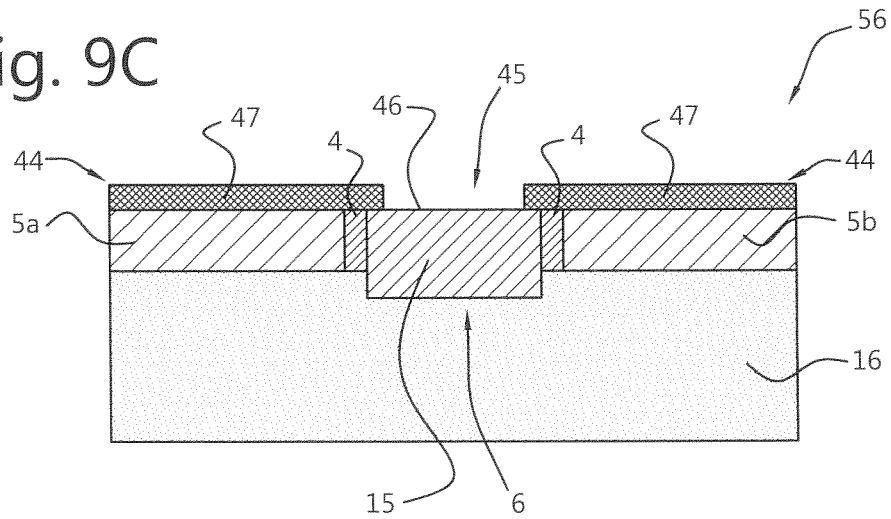

FIG. 9C shows the result of eighth, ninth and tenth process steps of the second embodiment of the method. In the eighth process step a second masking layer 44 is deposited on top of the non-intentionally doped layer 4 comprising the first 5a and second 5b selectively n-type doped contact regions. The second masking layer 44 comprises at least one of a silicon oxide ($SiO_x$) and a silicon nitride ($SiN_x$).

In the ninth process step a second lithographic process followed by a third selective etching process are used to provide a tubular-shaped recess in the second masking layer 44 to expose a surface area 46 of a portion of the non-intentionally doped layer 4 between the first 5a and second 5b selectively n-type doped contact regions. The exposed surface area 46 is arranged to surround for example the first selectively n-type doped contact region 5a. In the cross-sectional view of FIG. 9C only a first portion 45 of the tubular-shaped recess is shown.

In the tenth process step a diffusion process is used to diffuse p-type dopants, such as zinc (Zn) atoms, into the portion of the non-intentionally doped layer 4 between the first 5a and second 5b selectively n-type doped contact regions via said surface area 46 to define a first selectively p-type doped tubular-shaped current blocking region 6 that is arranged to surround in accordance with this example the first selectively n-type doped contact region 5a. In this way a first selectively p-type doped tubular-shaped current blocking region 6 is provided in the non-intentionally doped layer 4 as has been described for example in relation to FIGS. 3 and 5B. The first selectively p-type doped tubular-shaped current blocking region 6 has an activated p-type doping concentration between $1\times10^{16}$ cm$^{-3}$-$2\times10^{18}$ cm$^{-3}$, preferably less than or equal to $1\times10^{17}$ cm$^{-3}$. As the zinc atoms are diffused into a non-intentionally doped layer, the p-type doping concentration does not need to be as high as in the case of the n-type doped InP layer 3 that was described in relation to for example FIGS. 5A and 8B. In the case of the non-intentionally doped layer 4 shown in FIG. 9C, the p-type dopants only need to compensate any non-intentional n-type dopants that may have been introduced during growth of said non-intentionally doped InP layer 4. Typical background doping levels of said non-intentionally doped InP layer 4 are less than $1\times10^{17}$ cm$^{-3}$. It is noted that in the cross-sectional view of FIG. 9C only a first portion 15 of the first selectively p-type doped tubular-shaped region 6 is shown. The person skilled in the art will appreciate that depending on the degree of current blocking that is required for a specific application multiple selectively p-type doped tubular-shaped current blocking regions can be arranged that surround each other as has been described in relation to FIGS. 6 and 7.

Figure 9D:
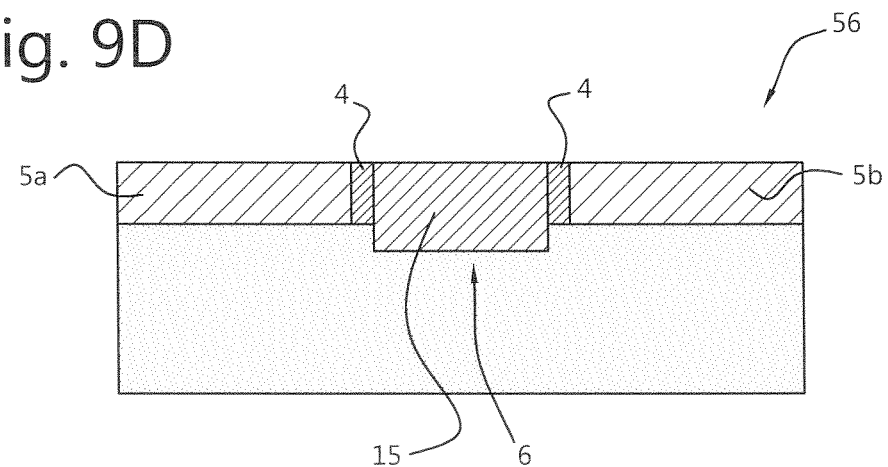

FIG. 9D shows the result of an eleventh process step of the second embodiment of the method. In the eleventh process step a fourth selective etching process is used for selectively removing remaining parts 47 of the second masking layer 44 from the non-intentionally doped layer 4 comprising the first 5a and second 5b selectively n-type doped contact regions and the first selectively p-type doped tubular-shaped region 6.

Figure 9E:
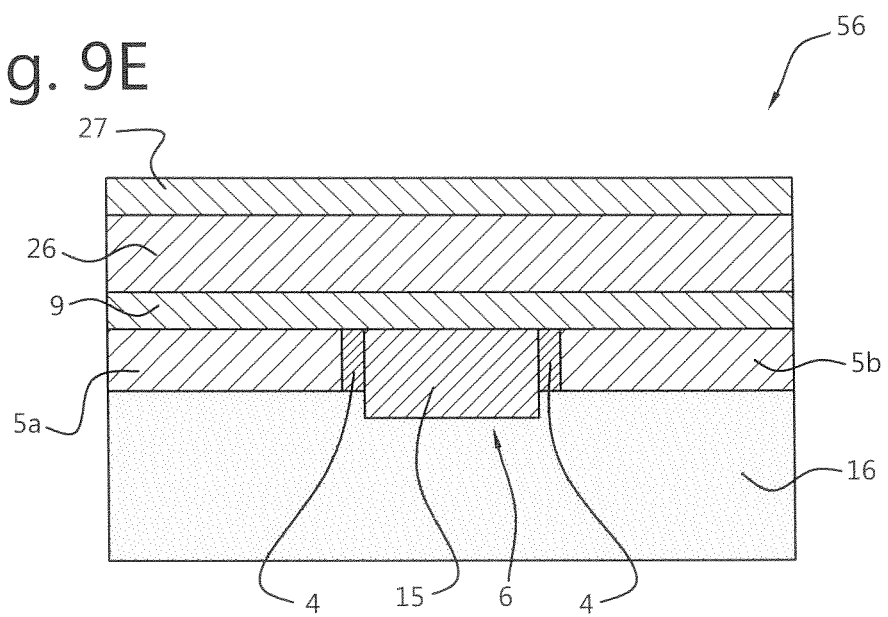

FIG. 9E shows the result of twelfth, thirteenth, and fourteenth process steps of the second embodiment of the method. In the twelfth process step a non-intentionally doped waveguide layer 9 comprising indium gallium arsenide phosphide (InGaAsP) is epitaxially grown on top of the non-intentionally doped layer 4 comprising the first 5a and second 5b selectively n-type doped contact regions and the first selectively p-type doped tubular-shaped region 6. The non-intentionally doped waveguide layer 9 enables the fabrication of a passive optical waveguide that enables optical communication between a first opto-electronic device and a second opto-electronic device that are fabricated on the semiconductor wafer 56. The n-type ohmic metal contacts of the first opto-electronic device are electrically isolated from the n-type ohmic metal contacts of the second opto-electronic device by the first selectively p-type doped tubular-shaped current blocking region 6.

In the thirteenth process step a p-type doped cladding layer 26 comprising indium phosphide (InP) is epitaxially grown on top of the non-intentionally doped waveguide layer 9. In the fourteenth process step a p-type doped contact layer 27 comprising indium gallium arsenide (InGaAs) is epitaxially grown on top of the p-type doped cladding layer 26. The p-type doped contact layer 27 has a higher activated p-type doping concentration than the p-type doped cladding layer 26 to allow the formation of low-resistance p-type ohmic metal contacts.

Figure 10:
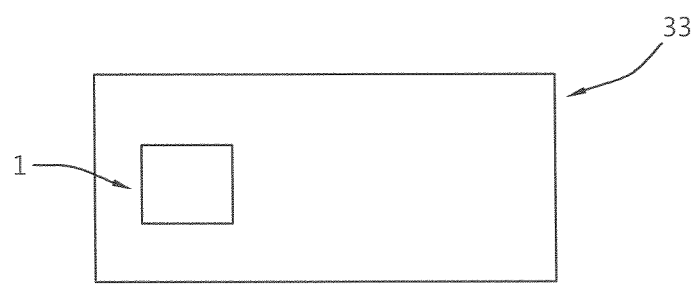
FIG. 10 shows a schematic view of an opto-electronic system comprising a PIC according to the present invention.

FIG. 10 shows a schematic view of an opto-electronic system 33 comprising a PIC 1 according to the present invention. Opto-electronic systems 33 according to the invention can advantageously be applied in for example telecommunications applications.

The present invention can be summarized as relating to a photonic integrated circuit 1 comprising first 10 and second 12 opto-electronic devices that are fabricated on a semiconductor wafer having an epitaxial layer stack 2 comprising an n-type indium phosphide-based contact layer 3 that is provided with at least one selectively p-type doped tubular-shaped region 6 for providing an electrical barrier between respective n-type contact regions of said first and second opto-electronic devices that are optically interconnected by a passive optical waveguide 14 that is fabricated in a non-intentionally doped waveguide layer 9 comprising indium gallium arsenide phosphide, said non-intentionally doped waveguide layer being arranged on top of said n-type contact layer, wherein a first portion 15 of said at least one selectively p-type doped tubular-shaped region is arranged underneath said passive optical waveguide between said first and second opto-electronic devices. The invention also relates to an opto-electronic system 33 comprising said photonic integrated circuit.

It will be clear to a person skilled in the art that the scope of the present invention is not limited to the examples discussed in the foregoing but that several amendments and modifications thereof are possible without deviating from the scope of the present invention as defined by the attached claims. In particular, combinations of specific features of various aspects of the invention may be made. An aspect of the invention may be further advantageously enhanced by adding a feature that was described in relation to another aspect of the invention. While the present invention has been illustrated and described in detail in the figures and the description, such illustration and description are to be considered illustrative or exemplary only, and not restrictive.

The present invention is not limited to the disclosed embodiments. Variations to the disclosed embodiments can be understood and effected by a person skilled in the art in practicing the claimed invention, from a study of the figures, the description and the attached claims. In the claims, the word "comprising" does not exclude other steps or elements, and the indefinite article "a" or "an" does not exclude a plurality. The mere fact that certain measures are recited in mutually different dependent claims does not indicate that a combination of these measures cannot be used to advantage. Any reference numerals in the claims should not be construed as limiting the scope of the present invention.

REFERENCE NUMERALS 1 photonic integrated circuit (PIC)
2 epitaxial layer stack
3 n-type doped contact layer
4 non-intentionally doped layer
5a first selectively n-type doped contact region of non-intentionally doped layer
5b second selectively n-type doped contact region of non-intentionally doped layer
6 first selectively p-type doped tubular-shaped region
7 first area of n-type doped contact layer
8 second area of n-type doped contact layer
9 non-intentionally doped waveguide layer
10 first opto-electronic device
11 first n-type ohmic metal contact
12 second opto-electronic device
13 second n-type ohmic metal contact
14 passive optical waveguide
15 first portion of the first selectively p-type doped tubular-shaped region
16 substrate
17 first boundary between substrate and n-type doped contact layer or non-intentionally doped layer
18 second boundary between n-type doped contact layer or non-intentionally doped layer and non-intentionally doped waveguide layer
19 first p-type ohmic metal contact
20 second selectively p-type doped tubular-shaped region
21 second portion of the second selectively p-type doped tubular-shaped region
22 second p-type ohmic metal contact
23 third area of n-type doped contact layer
25 third n-type ohmic metal contact
26 p-type doped cladding layer
27 p-type doped contact layer
28 recess in p-type doped contact layer
29 first p-type doped contact area
30 second p-type doped contact area
31 third boundary between p-type doped contact layer and p-type doped cladding layer
32 fourth boundary between p-type doped cladding layer and non-intentionally doped waveguide layer
33 opto-electronic system
34 masking layer
35 first portion of a tubular-shaped recess in the masking layer
36 exposed surface area of the n-type doped contact layer
37 remaining parts of masking layer
38 first masking layer
41 exposed first surface area of non-intentionally doped layer
42 exposed second surface area of non-intentionally doped layer
44 second masking layer
45 first portion of a tubular-shaped recess in the second masking layer
46 exposed surface area of non-intentionally doped layer
47 remaining parts of second masking layer
48 waveguide structure
49 PIN-diode
50 p-type ohmic metal contact
51 n-type ohmic metal contact
52 distributed Bragg reflector (DBR) laser
53 Mach-Zehnder modulator (MZM)
54 output monitor photodiode (PD)
55 relatively highly resistive portion of the p-type doped cladding layer
56 semiconductor wafer

What is claimed is:

1. A photonic integrated circuit, comprising:
a semiconductor wafer that has an epitaxial layer stack comprising:
an n-type doped contact layer comprising indium phosphide or a non-intentionally doped layer comprising indium phosphide, said non-intentionally doped layer comprising at least two selectively n-type doped contact regions, wherein said n-type doped contact layer or said non-intentionally doped layer outside said at least two selectively n-type doped contact regions comprises a first selectively p-type doped tubular-shaped region that is configured and arranged to provide a first electrical barrier between:
a first area of said n-type doped contact layer that is surrounded by said first selectively p-type doped tubular-shaped region and a second area of said n-type doped contact layer that is arranged outside said first selectively p-type doped tubular-shaped region; or
a first selectively n-type doped contact region of said non-intentionally doped layer that is surrounded by said first selectively p-type doped tubular-shaped region and a second selectively n-type doped contact region of said non-intentionally doped layer that is arranged outside said first selectively p-type doped tubular-shaped region; and
a non-intentionally doped waveguide layer comprising indium gallium arsenide phosphide that is arranged on top of said n-type doped contact layer or said non-intentionally doped layer;
a first opto-electronic device that is arranged in said first area of said n-type doped contact layer that is surrounded by said first selectively p-type doped tubular-shaped region or in said first selectively n-type doped contact region of said non-intentionally doped layer that is surrounded by said first selectively p-type doped tubular-shaped region, said first opto-electronic device comprising a first n-type ohmic metal contact that is arranged at a first location on said n-type doped contact layer within said first area or at a first location on said first selectively n-type doped contact region;
a second opto-electronic device that is arranged in said second area of said n-type doped contact layer that is arranged outside said first selectively p-type doped tubular-shaped region or in said second selectively n-type doped contact region of said non-intentionally doped layer that is arranged outside said first selectively p-type doped tubular-shaped region, said second opto-electronic device comprising a second n-type ohmic metal contact that is arranged at a second location on said n-type doped contact layer within said second area or at a second location on said second selectively n-type doped contact region; and
a passive optical waveguide comprising said non-intentionally doped waveguide layer and being arranged to optically interconnect said first opto-electronic device and said second opto-electronic device, wherein a first portion of said first selectively p-type doped tubular-shaped region is arranged underneath said passive optical waveguide between said first opto-electronic device and said second opto-electronic device.

2. The photonic integrated circuit according to claim 1, wherein at least said first portion of said first selectively p-type doped tubular-shaped region that is arranged underneath the non-intentionally doped waveguide layer of said passive optical waveguide has a thickness in a radial direction thereof between 1 µm-100 µm.

3. The photonic integrated circuit according to claim 2, wherein said first selectively p-type doped tubular-shaped region comprises zinc as p-type dopant.

4. The photonic integrated circuit according to claim 1, wherein said first selectively p-type doped tubular-shaped region comprises zinc as p-type dopant.

5. The photonic integrated circuit according to claim 1, wherein said first selectively p-type doped tubular-shaped region comprises an activated p-type doping concentration between $1 \times 10^{16}$ cm$^{-3}$-$2 \times 10^{18}$ cm$^{-3}$.

6. The photonic integrated circuit according to claim 1, comprising a substrate on top of which said n-type doped contact layer or said non-intentionally doped layer of said epitaxial layer stack is arranged, said substrate comprising one of semi-insulating indium phosphide, p-type doped indium phosphide and n-type doped indium phosphide that is compensated using iron atoms to provide at least a semi-insulating surface layer on top of which said n-type doped contact layer or said non-intentionally doped layer is arranged, wherein said first selectively p-type doped tubular-shaped region is arranged to extend in an axial direction thereof at least from a first boundary between said substrate and said n-type doped contact layer or said non-intentionally doped layer to a second boundary between said n-type doped contact layer or said non-intentionally doped layer and said non-intentionally doped waveguide layer.

7. The photonic integrated circuit according to claim 1, wherein said first selectively p-type doped tubular-shaped region is provided with a first p-type ohmic metal contact.

8. The photonic integrated circuit according to claim 7, wherein a short circuit is arranged between said first p-type ohmic metal contact and one of said first n-type ohmic metal contact of said first opto-electronic device and said second n-type ohmic metal contact of said second opto-electronic device.

9. The photonic integrated circuit according to claim 1, wherein said n-type doped contact layer or said non-intentionally doped layer outside said at least two selectively n-type doped contact regions comprises a second selectively p-type doped tubular-shaped region that is arranged at a predetermined distance of said first selectively p-type doped tubular shaped region and configured to surround said first selectively p-type doped tubular-shaped region to provide a second electrical barrier between:
said first area of said n-type doped contact layer that is surrounded by both said first selectively p-type doped tubular-shaped region and said second selectively p-type doped tubular-shaped region and said second area of said n-type doped contact layer that is arranged outside both said first selectively p-type doped tubular-shaped region and said second selectively p-type doped tubular-shaped region; or
said first selectively n-type doped contact region of said non-intentionally doped layer that is surrounded by both said first selectively p-type doped tubular-shaped region and said second selectively p-type doped tubular-shaped region and said second selectively n-type doped contact region of said non-intentionally doped layer that is arranged outside both said first selectively p-type doped tubular-shaped region and said second selectively p-type doped tubular-shaped region;
wherein a second portion of said second selectively p-type doped tubular-shaped region is arranged underneath said passive optical waveguide between said first opto-electronic device and said second opto-electronic device, wherein at least one of said first selectively p-type doped tubular-shaped region and said second selectively p-type doped tubular-shaped region comprises zinc as p-type dopant, and wherein each of said first selectively p-type doped tubular-shaped region and said second selectively p-type doped tubular-shaped region comprises an activated p-type doping concentration between $1 \times 10^{16}$ cm$^{-3}$-$2 \times 10^{18}$ cm$^{-3}$.

10. The photonic integrated circuit according to claim 9, wherein at least said first portion of said first selectively p-type doped tubular-shaped region and at least said second portion of said second selectively p-type doped tubular-shaped region that are arranged underneath the non-intentionally doped waveguide layer of said passive optical waveguide each have a thickness in a radial direction thereof between 1 µm-100 µm.

11. The photonic integrated circuit according to claim 10, comprising a substrate on top of which said n-type doped contact layer or said non-intentionally doped layer of said epitaxial layer stack is arranged, said substrate comprising one of semi-insulating indium phosphide, p-type doped indium phosphide and n-type doped indium phosphide that is compensated using iron atoms to provide at least a semi-insulating surface layer n top of which said n-type doped contact layer or said non-intentionally doped layer is arranged, wherein at least one of said first selectively p-type doped tubular-shaped region and said second selectively p-type doped tubular-shaped region is arranged to extend in an axial direction thereof at least from a first boundary between said substrate and said n-type doped contact layer or said non-intentionally doped layer to a second boundary between said n-type doped contact layer or said non-intentionally doped layer and said non-intentionally doped waveguide layer.

12. The photonic integrated circuit according to claim 9, comprising a substrate on top of which said n-type doped contact layer or said non-intentionally doped layer of said epitaxial layer stack is arranged, said substrate comprising one of semi-insulating indium phosphide, p-type doped indium phosphide and n-type doped indium phosphide that is compensated using iron atoms to provide at least a semi-insulating surface layer on top of which said n-type doped contact layer or said non-intentionally doped layer is arranged, wherein at least one of said first selectively p-type doped tubular-shaped region and said second selectively p-type doped tubular-shaped region is arranged to extend in an axial direction thereof at least from a first boundary between said substrate and said n-type doped contact layer or said non-intentionally doped layer to a second boundary between said n-type doped contact layer or said non-intentionally doped layer and said non-intentionally doped waveguide layer.

13. The photonic integrated circuit according to claim 9, wherein said first selectively p-type doped tubular-shaped region is provided with a first p-type ohmic metal contact and/or said second selectively p-type doped tubular-shaped region is provided with a second p-type ohmic metal contact.

14. The photonic integrated circuit according to claim 13, wherein a third area of said n-type doped contact layer that is arranged between said first selectively p-type doped tubular-shaped region and said second selectively p-type doped tubular-shaped region or a third selectively n-type doped contact region of said non-intentionally doped layer that is arranged between said first selectively p-type doped tubular-shaped region and said second selectively p-type doped tubular-shaped region is provided with a third n-type ohmic metal contact, wherein a short circuit is arranged between at least one of:

said first p-type ohmic metal contact and one of said first n-type ohmic metal contact of said first opto-electronic device, said second n-type ohmic metal contact of said second opto-electronic device, and said third n-type ohmic metal contact; and said second p-type ohmic metal contact and one of said first n-type ohmic metal contact of said first opto-electronic device, said second n-type ohmic metal contact of said second opto-electronic device, and said third n-type ohmic metal contact.

15. The photonic integrated circuit according to claim 1, wherein the epitaxial layer stack further comprises:

a p-type doped cladding layer comprising indium phosphide that is arranged on top of said non-intentionally doped waveguide layer; and a p-type doped contact layer comprising indium gallium arsenide that is arranged on top of said p-type doped cladding layer, said p-type doped contact layer having a higher activated p-type doping concentration than said p-type doped cladding layer; and wherein said p-type doped contact layer is provided with a recess that is configured and arranged such that said p-type doped contact layer is interrupted and is provided with a first p-type doped contact area and a second p-type doped contact area, the recess having a width, as seen in a direction parallel to a third boundary between said p-type doped contact layer and said p-type doped cladding layer, in a range between 5 μm and 200 μm.

16. The photonic integrated circuit according to claim 4, wherein the recess is configured and arranged to extend into the p-type doped cladding layer up to a predefined distance from a fourth boundary between said p-type doped cladding layer and the non-intentionally doped waveguide layer, the predefined distance from said fourth boundary being in a range between 0.5 μm and 5 μm.

17. An opto-electronic system comprising a photonic integrated circuit according to claim 1.

* * * * *

UNITED STATES PATENT AND TRADEMARK OFFICE
CERTIFICATE OF CORRECTION

PATENT NO. : 11,585,979 B2  
APPLICATION NO. : 16/735797  
DATED : February 21, 2023  
INVENTOR(S) : Pieter Ids Kuindersma et al.

Page 1 of 1

It is certified that error appears in the above-identified patent and that said Letters Patent is hereby corrected as shown below:

In the Claims

Please amend Column 28, Line 13 as follows:  
16. The photonic integrated circuit according to claim 15, Signed and Sealed this  
Eleventh Day of February, 2025

Coke Morgan Stewart  
*Acting Director of the United States Patent and Trademark Office*